United States Patent
Jansen et al.

(10) Patent No.: US 9,544,103 B2
(45) Date of Patent: Jan. 10, 2017

(54) DIFFERENTIAL WIRED COMMUNICATION LINK QUALITY DETECTOR AND DIFFERENTIAL WIRED COMMUNICATION LINK QUALITY DETECTION METHOD

(71) Applicant: EUROPEAN SPACE AGENCY, Paris (FR)

(72) Inventors: Richard Jansen, Oegstgeest (NL); Jorgen Ilstad, Noordwijk (NL)

(73) Assignee: EUROPEAN SPACE AGENCY, Paris (FR)

( * ) Notice: Subject to any disclaimer, the term of this patent is extended or adjusted under 35 U.S.C. 154(b) by 0 days.

(21) Appl. No.: 14/933,864

(22) Filed: Nov. 5, 2015

(65) Prior Publication Data
US 2016/0127084 A1    May 5, 2016

(30) Foreign Application Priority Data

Nov. 5, 2014   (EP) .................................... 14191802

(51) Int. Cl.
| H04B 3/46 | (2015.01) |
| H04L 1/20 | (2006.01) |
| H04L 25/08 | (2006.01) |
| G01R 31/02 | (2006.01) |
| H03K 5/19 | (2006.01) |
| H04L 1/24 | (2006.01) |
| H04L 25/02 | (2006.01) |
| H04B 3/30 | (2006.01) |

(52) U.S. Cl.
CPC ................. *H04L 1/20* (2013.01); *G01R 31/02* (2013.01); *H03K 5/19* (2013.01); *H04B 3/46* (2013.01); *H04L 1/24* (2013.01); *H04L 25/0274* (2013.01); *H04L 25/085* (2013.01); *H04B 3/30* (2013.01)

(58) Field of Classification Search
CPC ..................................................... H04B 3/487
USPC ......................................................... 375/224
See application file for complete search history.

(56) References Cited

U.S. PATENT DOCUMENTS

| 6,559,682 B1 | 5/2003 | Kyles et al. |
| 6,943,591 B1 | 9/2005 | Hannan et al. |
| 2005/0040864 A1 | 2/2005 | Ficken et al. |

*Primary Examiner* — Lihong Yu
(74) *Attorney, Agent, or Firm* — Oliff PLC

(57) ABSTRACT

A method of determining link failure in a receiver for receiving a differential voltage signal via a first signal line and a second signal line, the method including: obtaining a first quantity depending on the larger one of a maximum value over time of a voltage level that is attained in the first signal line and a maximum value over time of a voltage level that is attained in the second signal line; obtaining a second quantity depending on a maximum value over time of an average of an instantaneous voltage level in the first signal line and an instantaneous voltage level in the second signal line; and determining that the link failure has occurred on the basis of the first quantity and the second quantity.

19 Claims, 17 Drawing Sheets

DIFFERENTIAL WIRED COMMUNICATION LINK QUALITY DETECTOR AND DIFFERENTIAL WIRED COMMUNICATION LINK QUALITY DETECTION METHOD

TECHNICAL FIELD OF THE INVENTION

The present invention relates to a method of determining link failure in a receiver for receiving a differential voltage signal and to an apparatus for determining link failure in a receiver for receiving a differential voltage signal.

The invention is particularly, though not exclusively, applicable to high-speed differential wired communication links, e.g. for communication according to the low-voltage differential signaling (LVDS) standard, the current mode logic (CML) standard, the voltage mode logic (VML) standard, the low-voltage positive/pseudo-emitter coupled logic (LVPECL) standard, or any other differential physical signaling standard.

BACKGROUND OF THE INVENTION

High-speed differential point-to-point physical signaling can be used for digital communication between different modules and equipment, e.g. in spacecraft. The receiver amplifies the small differential signal conforming to any applicable differential physical signaling standard, such as LVDS, CML, VML, LVPECL, that is received from outside the module or equipment and converts said small differential signal into a single-ended CMOS signal that can be read by digital devices. Modes of link failure include, for example, single short failure (or single short link failure, single short circuit failure)—one input line is short-circuited to a fixed voltage, double short failure (or double short link failure, double short circuit failure)—both input lines are short-circuited to fixed voltages), single open failure (or single open link failure, single open circuit failure)—one input line is disconnected, and double open failure (or double open link failure, double open circuit failure)—both input lines are disconnected. Disconnection of an input line may be due to a broken connection or due to a receiver line being connected to a switched-off transmitter that is operating in cold redundancy.

Conventionally, communication link failure mitigation techniques, e.g. for LVDS, are implemented in order to prevent erroneous data from being accepted as valid data after being received. Such erroneous data may be present in case of link disconnection in which case noise or interference can be picked up. Moreover, due to a potentially large receiver gain, the receiver may start to self-oscillate in case of link disconnection. The most common link failure mitigation techniques are to (i) add hysteresis in the receiver, (ii) introduce an offset in the differential signal, or (iii) introduce a window comparator to prevent, in case of link disconnection, the amplification of noise at the receiver input and the passing of said amplified noise as real data to the module or equipment.

However, the above approaches fail to identify any or all of single or double short failures, signal distortion, interference or self-oscillating signals. In particular, each of the above approaches fails to identify single or double short failures and single open failures, as well as self oscillating signals. Moreover, the above approaches lack the ability to assess the quality of the link and do not allow for a discrimination of typical possible link failure modes.

Not being able to detect link failure and preventing erroneous data from being accepted as valid data could lead to damage or loss of the respective module or equipment. For instance, in the case of space applications, accepting erroneous data as valid data and feeding same to the digital devices controlling operation of the module or equipment of a spacecraft could result in the loss of the spacecraft.

Accordingly, there is a need for a method and an apparatus capable of reliably detecting link failure in a receiver for receiving differential voltage signals.

SUMMARY OF THE INVENTION

It is an object of the present invention to overcome the limitations of the prior art discussed above. It is another object of the invention to provide a method and an apparatus capable of detecting link failure in a receiver for receiving differential voltage signals. It is yet another object of the invention to provide a method and an apparatus capable of detecting any or all of a single short failure, double short failure, single open failure, and double open failure.

In view of the above objects, the present invention proposes a method of determining link failure in a receiver for receiving a differential voltage signal and an apparatus for determining a link failure in a receiver for receiving a differential voltage signal, having the features of the respective independent claims.

According to an aspect of the invention, a method of determining link failure in a receiver for receiving a differential voltage signal via a first signal line and a second signal line comprises: obtaining a first quantity depending on the larger one of a maximum value over time of a voltage level that is attained in the first signal line and a maximum value over time of a voltage level that is attained in the second signal line; obtaining a second quantity depending on a maximum value over time for a specified period of an average of an instantaneous voltage level in the first signal line and an instantaneous voltage level in the second signal line; and determining that the link failure has occurred on the basis of the first quantity and the second quantity. The method may involve removing a common mode signal from the signals respectively received through the first and second signal lines. The second quantity may be said maximum value over time of an average of an instantaneous voltage level in the first signal line and an instantaneous voltage level in the second signal line for a predetermined period of time. Determining that the link failure has occurred may involve comparing the first quantity and the second quantity. Determining that the link failure has occurred may involve: determining a difference between the first quantity and the second quantity; and comparing said difference to a predetermined threshold.

Configured as above, the inventive method enables to identify a number of link failures more accurately than possible in the prior art. In particular, by recording the maximum value over a predetermined period of time, double short failures are more reliably identified. By comparing the first quantity (e.g. the larger one of a peak value of the positive signal and a peak value of the negative signal over the predetermined period of time) to the second quantity (e.g. the peak value of the common mode over the predetermined period of time) a low strength signal that would be present in case of a double short failure can be identified in an accurate, reliable and effective manner. Likewise, a low signal strength that would be reliably detected by the inventive method is present for double open circuit failures in the absence of interference or noise, or when the capacitive load on the line is sufficiently large.

In embodiments, the method may further comprise: obtaining a third quantity depending on a time-integrated value of an absolute value (modulus) of a difference between the instantaneous voltage level in the first signal line and the instantaneous voltage level in the second signal line; and determining that the link failure has occurred on the basis of the first quantity, the second quantity, and the third quantity. Obtaining the third quantity may involve time-filtering, e.g. by means of an RC-filter, said time-integrated absolute value of the difference between the instantaneous voltage level in the first signal line and the instantaneous voltage level in the second signal line. Said time integration may be performed over a predetermined period of time. Determining that the link failure has occurred may involve comparing the first quantity, the second quantity, and the third quantity. Determining that the link failure has occurred may involve: determining a difference between the first quantity and the second quantity; and determining whether or not said difference is larger than a predetermined factor times the third quantity.

Configured as above, the inventive method considers, in addition to time averaged peak values of the differential signal, also a time-averaged value of the signal strength, which is understood to be the time filtered time integration of the absolute value of the differential input value. Thus, by taking into account the third quantity (e.g. a time average of the time integrated absolute value of the differential input voltage) and comparing same to a difference between the first quantity (e.g. the larger one of a peak value of the positive signal and a peak value of the negative signal) and the second quantity (e.g. the peak value of the common mode), yielding the time averaged differential signal peak value, also peaked (or "spiky") signals, which do not relate to a valid LVDS signal, but for which the relevant peak values nevertheless are above the relevant thresholds, may be identified as a distorted (i.e. invalid) signal. Such signals may correspond to single open failures, which are therefore reliably detected, provided that only small capacitive loads are attached to the open input terminal. Likewise, double open failures are reliably detected, provided that noise and interference pick-up is below the expected minimum amplitude threshold.

In embodiments, the method may further comprise: applying a periodic current to the first signal line and the second signal line; obtaining a fourth quantity depending on an average value over time of an average of the instantaneous voltage level in the first signal line and the instantaneous voltage level in the second signal line; obtaining a fifth quantity depending on an average value over time of averages of the instantaneous voltage level in the first signal line and the instantaneous voltage level in the second signal line, said averages being sampled in accordance with the periodic current; and determining that the link failure has occurred on the basis of the fourth quantity and the fifth quantity. Said averages of the instantaneous voltage level in the first signal line and the instantaneous voltage level in the second signal line may be obtained at predetermined timings during each period of the periodic current. The predetermined timings may be timings for which the periodic current attains one of its extremal values, e.g. its maximum or its minimum. Determining that the link failure has occurred may involve comparing the fourth quantity and the fifth quantity. Determining that the link failure has occurred may also involve: determining an impedance of a conductor formed by the first signal line and the second signal line on the basis of a difference between the fourth quantity and the fifth quantity and an amplitude of the periodic current; and comparing said impedance to a predetermined threshold. Said impedance of said conductor may be a common-mode impedance.

Configured as above, also double open failures in which noise pick-up is large can be reliably detected. Based on the fourth quantity (e.g. a time average of the common-mode voltage) and the fifth quantity (e.g. a time average of the common-mode voltage measured synchronously with the applied current, a common-mode impedance of the communication link can be determined. A large common mode impedance is indicative of a single open failure or a double open failure, which can therefore be reliably identified. This identification of the single or double open failure is independent of the nature of the received LVDS signal, so that even noise pick-up or induced self-oscillations resembling a valid LVDS signal do not hinder detection of the failure condition. Further, since the periodic current is applied in common mode, it does not affect transmission/reception of the differential signal.

In embodiments, the method may further comprise: obtaining a sixth quantity depending on a maximum value over time of a voltage level that is attained in one of the first signal line and the second signal line and a minimum value over time of the voltage level that is attained in the one of the first signal line and the second signal line; and determining that the link failure has occurred on the basis of the sixth quantity. Determining that the link failure has occurred may involve comparing the sixth quantity to a predetermined threshold value. The method may further comprise: obtaining a seventh quantity depending on a maximum value over time over of a voltage level that is attained in the other one of the first signal line and the second signal line and a minimum value over time of the voltage level that is attained in the other one of the first signal line and the second signal line; and determining that the link failure has occurred on the basis of the sixth quantity and the seventh quantity. Determining that the link failure has occurred may involve comparing the sixth quantity and the seventh quantity.

Configured as above, the inventive method reliably identifies single and double short failures, since for these failures at least one of the input signals has low signal amplitude, which is reliably identified by comparing the sixth and/or seventh quantities (e.g. positive and/or negative signal amplitudes) to a predetermined threshold (e.g. the minimum expected signal amplitude). Likewise, in addition to single open failures with small capacitive loads attached to the open terminal, the inventive method defined above reliably identifies single and double open failures, provided that noise pick-up and/or induced self-oscillations are less than an expected signal amplitude threshold. The latter is the case for large capacitive loads attached to the open terminal(s).

According to another aspect of the invention, an apparatus for determining link failure in a receiver for receiving a differential voltage signal via a first signal line and a second signal line comprises: first determining means for obtaining a first quantity depending on the larger one of a maximum value over time of a voltage level that is attained in the first signal line and a maximum value over time of a voltage level that is attained in the second signal line; second determining means for obtaining a second quantity depending on a maximum value over time of an average of an instantaneous voltage level in the first signal line and an instantaneous voltage level in the second signal line; and link failure determining means for determining that the link failure has occurred, wherein the link failure determining means is configured to determine that the link failure has occurred on the basis of the first quantity and the second quantity. The apparatus may be configured to remove or suppress a common-mode signal from the signals respectively received through the first and second signal lines. The link failure determining means may be configured to determine that the link failure has occurred by comparing the first quantity and the second quantity. The link failure determining means may be configured to determine that the link failure has occurred by: determining a difference between the first quantity and the second quantity; and comparing said difference to a predetermined threshold.

In embodiments, the apparatus may further comprise: third determining means for obtaining a third quantity depending on a time-integrated value of an absolute value of a difference between the instantaneous voltage level in the first signal line and the instantaneous voltage level in the second signal line, wherein the link failure determining means is configured to determine that the link failure has occurred on the basis of the first quantity, the second quantity, and the third quantity. Said time integration may be performed over a predetermined period of time. The link failure determining means may be configured to determine that the link failure has occurred by: determining a difference between the first quantity and the second quantity; and determining whether or not said difference is larger than a predetermined factor times the third quantity. The apparatus may further comprise filtering means for filtering the third quantity over time, such as an RC filter, for example.

In embodiments, the apparatus may further comprise: current generation means for applying a periodic current to the first signal line and the second signal line; fourth determining means for obtaining a fourth quantity depending on an average value over time of an average of the instantaneous voltage level in the first signal line and the instantaneous voltage level in the second signal line; and fifth determining means for obtaining a fifth quantity depending on an average value over time of averages of the instantaneous voltage level in the first signal line and the instantaneous voltage level in the second signal line, said averages being sampled in accordance with the periodic current, wherein the link failure determining means is configured to determine that the link failure has occurred on the basis of the fourth quantity and the fifth quantity. Said averages of the instantaneous voltage level in the first signal line and the instantaneous voltage level in the second signal line may be obtained at predetermined timings during each period of the periodic current. The predetermined timings may be timings for which the periodic current attains one of its extremal values, e.g. its maximum or its minimum. The link failure determining means may be configured to determine that the link failure has occurred by comparing the fourth quantity and the fifth quantity. The link failure determining means may be configured to determine that the link failure has occurred by: determining an impedance of a conductor formed by the first signal line and the second signal line on the basis of a difference between the fourth quantity and the fifth quantity and an amplitude of the periodic current; and comparing said impedance to a predetermined threshold.

In embodiments, the apparatus may further comprise: sixth determining means for obtaining a sixth quantity depending on a maximum value over time of a voltage level that is attained in one of the first signal line and the second signal line and a minimum value over time of a voltage level that is attained in the one of the first signal line and the second signal line, wherein the link failure determining means is configured to determine that the link failure has occurred on the basis of the sixth quantity. The link failure determining means may be configured to determine that the link failure has occurred by comparing the sixth quantity to a predetermined threshold value. The apparatus may further comprise: seventh determining means for obtaining a seventh quantity depending on a maximum value over time of a voltage level that is attained in the other one of the first signal line and the second signal line and a minimum value over time of a voltage level that is attained in the other one of the first signal line and the second signal line, wherein the link failure determining means is configured to determine that the link failure has occurred on the basis of the sixth quantity and the seventh quantity. The link failure determining means may be configured to determine that the link failure has occurred by comparing the sixth quantity and the seventh quantity.

DETAILED DESCRIPTION OF THE INVENTION

Preferred embodiments of the present invention will be described in the following with reference to the accompanying figures, wherein in the figures, identical objects are indicated by identical reference numbers. It is understood that the present invention shall not be limited to the described embodiments, and that the described features and aspects of the embodiments may be modified and/or combined to form further embodiments of the present invention.

Figure 1:
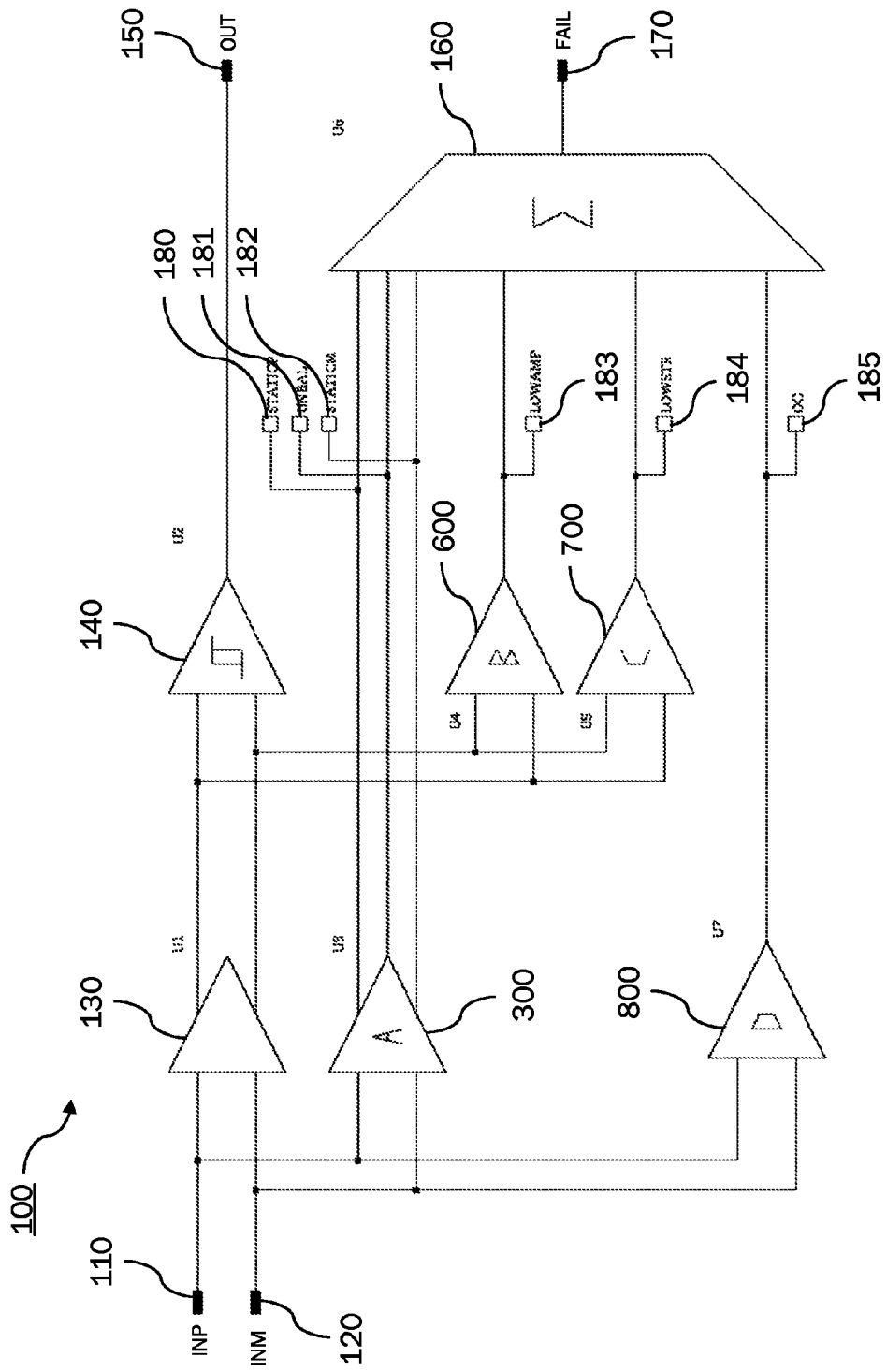
FIG. 1 schematically illustrates an example of an implementation of an embodiment of the invention in a receiver for receiving a differential signal.

A schematic diagram of an inventive apparatus for detecting link failure in a receiver for receiving a differential voltage signal via a first signal line and a second signal line is shown in FIG. 1. The apparatus may correspond to the receiver, be part of the receiver, or be distinct from the receiver, as long as it is enabled to detect said link failure. In the non-limiting case illustrated in FIG. 1, the apparatus corresponds to the receiver and comprises a LVDS finite gain front-end differential amplifier, preferably with high common-mode rejection together with signal level, amplitude, and strength indicators. The present invention is applicable to any kind of differential signaling. Without intended limitation, exclusively for reasons of conciseness, exemplary reference will be made in the following to detecting link failure for a LVDS receiver. Any statements made below in connection with the LVDS standard are understood to likewise apply to other standards of differential signaling, and the present invention is understood to apply to all such standards. In other words, the below disclosure may be understood in a sense that each instance of "LVDS" could be replaced by "standard of differential signaling", or the like.

The receiver 100 illustrated in FIG. 1 has a first input port 110 for receiving a first signal via a first signal line (not shown) and a second input port 120 for receiving a second signal via a second signal line (not shown). Without intended limitation, the first signal (voltage level) at the first input port 110 will be denoted INP (positive signal) and the second signal (voltage level) at the second signal port 120 will be denoted INM (negative signal). The first signal and the second signal taken together constitute a differential signal that is received by the receiver. That is, for a proper signal, the second signal attains its low level when the first signal attains its high level, and vice versa. The first and second signal lines are part of or correspond to a communication link (or link for short).

The receiver 100 further comprises a linear low-noise amplifier (front-end amplifier) 130 that may also be configured to remove a common mode signal received through the link. The output of the linear low-noise amplifier 130 is routed to a Schmitt trigger 140 that is configured to provide the output signal with a fixed applied hysteresis. Applying the hysteresis ensures that additional output signal toggles do not occur during transitions in reaction to noise or spurious signals at the input that are lower than the hysteresis threshold. The receiver 100 further comprises an output port (output node) 150 for outputting an output signal (e.g. a single-ended signal) derived from the differential signal, and a link quality monitor 160. The link quality monitor 160 has an output port (output node) 170.

The receiver 100 (i.e. the apparatus for detecting link failure) may further comprise a differential input signal amplitude detection block B (first link failure detection unit, first link failure detection block, first block) 600, a differential signal strength indicator block C (second link failure detection unit, second link failure detection block, second block) 700, an open circuit detector block D (third link failure detection unit, third link failure detection block, third block) 800, and an input swing and balance detection block A (fourth link failure detection unit, fourth link failure detection block, fourth block) 300, which will be each described in more detail below. It is understood that the receiver 100 (i.e. the apparatus for detecting link failure) may comprise any one, any two, any three, or all four of the first to fourth link failure detection blocks.

It is to be understood that the detailed description below relates to method features and corresponding apparatus features alike.

Figure 2:
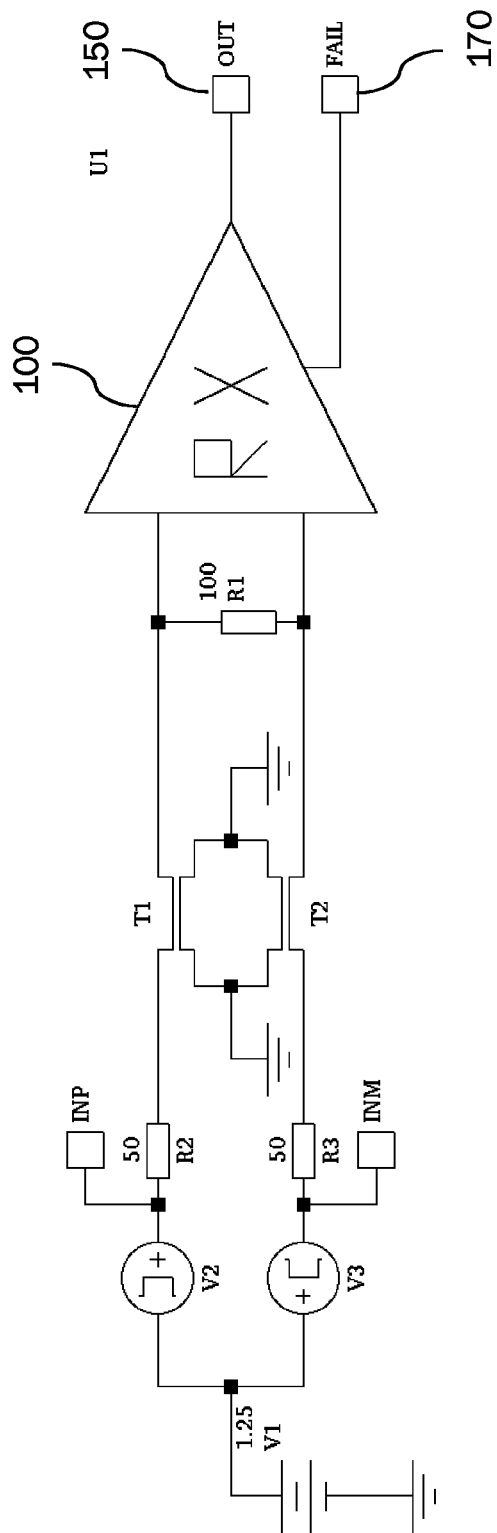
FIG. 2 schematically illustrates a test bench for testing the receiver.

A test bench for the receiver 100 is shown in FIG. 2. Therein, the LVDS signal arrives at the receiver 100 from a balanced 100 Ohm transmission line, terminated differentially with 100 Ohm.

Differential Input Signal Amplitude Detector

The output of the low-noise amplifier 130 in FIG. 1 is also routed to the first link failure detection block 600. Alternatively, the differential input signal may be routed directly to the first link failure detection block 600. The first link failure detection block 600 obtains (e.g. determines) a first quantity depending on (e.g. being indicative of) the larger one of a maximum value over time of a voltage level that is attained in the first signal line and a maximum value over time of a voltage level that is attained in the second signal line, and obtains (e.g. determines) a second quantity depending on (e.g. being indicative of) a maximum value over time of an average of an instantaneous voltage level in the first signal line and an instantaneous voltage level in the second signal line. The first link failure detection block 600 determines whether or not link failure is present on the basis of the first quantity and the second quantity, and raises an appropriate error flag (described below) if the link failure is present. It is understood that the first link failure detection block 600, or more generally, the apparatus for detecting link failure according to the present invention, comprises appropriate means for accomplishing the above tasks, as well as for additional tasks described below. It is further understood that a method for detecting link failure according to the present invention comprises respective method steps.

If the voltage level of the positive signal that is input to the first link failure detection block 600 is denoted $V_{INP}$ and the voltage level of the negative signal that is input to the first link failure detection block 600 is denoted $V_{INM}$, the first quantity depends on (e.g. is indicative of)

$$\max(\max_{t \in T}(V_{INP}(t)), \max_{t \in T}(V_{INM}(t))), \quad (1)$$

and the second quantity depends on (e.g. is indicative of)

$$\max_{t \in T}\left(\frac{V_{INP}(t) + V_{INM}(t)}{2}\right), \quad (2)$$

where T is either a predetermined period of time with fixed boundaries in time, or a moving time window of given length (duration), e.g. comprising all timings less than a predetermined period of time prior to a present timing. That is, the maximum/minimum voltage level over time is a maximum/minimum voltage level that is respectively attained during a given period of time or during a given moving time window of given length (duration), e.g. including all timings less than a given period of time prior to a present timing.

On the basis of the first quantity and the second quantity, the first link failure detection block 600 determines whether or not link failure has occurred, and raises and outputs a respective first error flag LOWAMP 183 in case that link failure has occurred. This determination may involve comparing the first quantity and the second quantity. This determination may further involve determining a difference between the first quantity and the second quantity, and comparing said difference to a predetermined threshold value.

Put differently, the first link failure detection block 600 measures (determines) a signal amplitude of the differential signal (differential signal amplitude), i.e. without the common-mode signal, e.g. by determining the difference between the first quantity and the second quantity, and compares same to the minimum required level for reliable LVDS signal transmission (or for signal transmission in accordance with a respective alternative standard of differential signaling). The first quantity corresponds to the peak amplitude of the positive signal or the negative signal, whichever is largest, for example, and the second quantity corresponds to the peak amplitude of the common-mode of the positive signal and the negative signal, for example.

Figure 4:
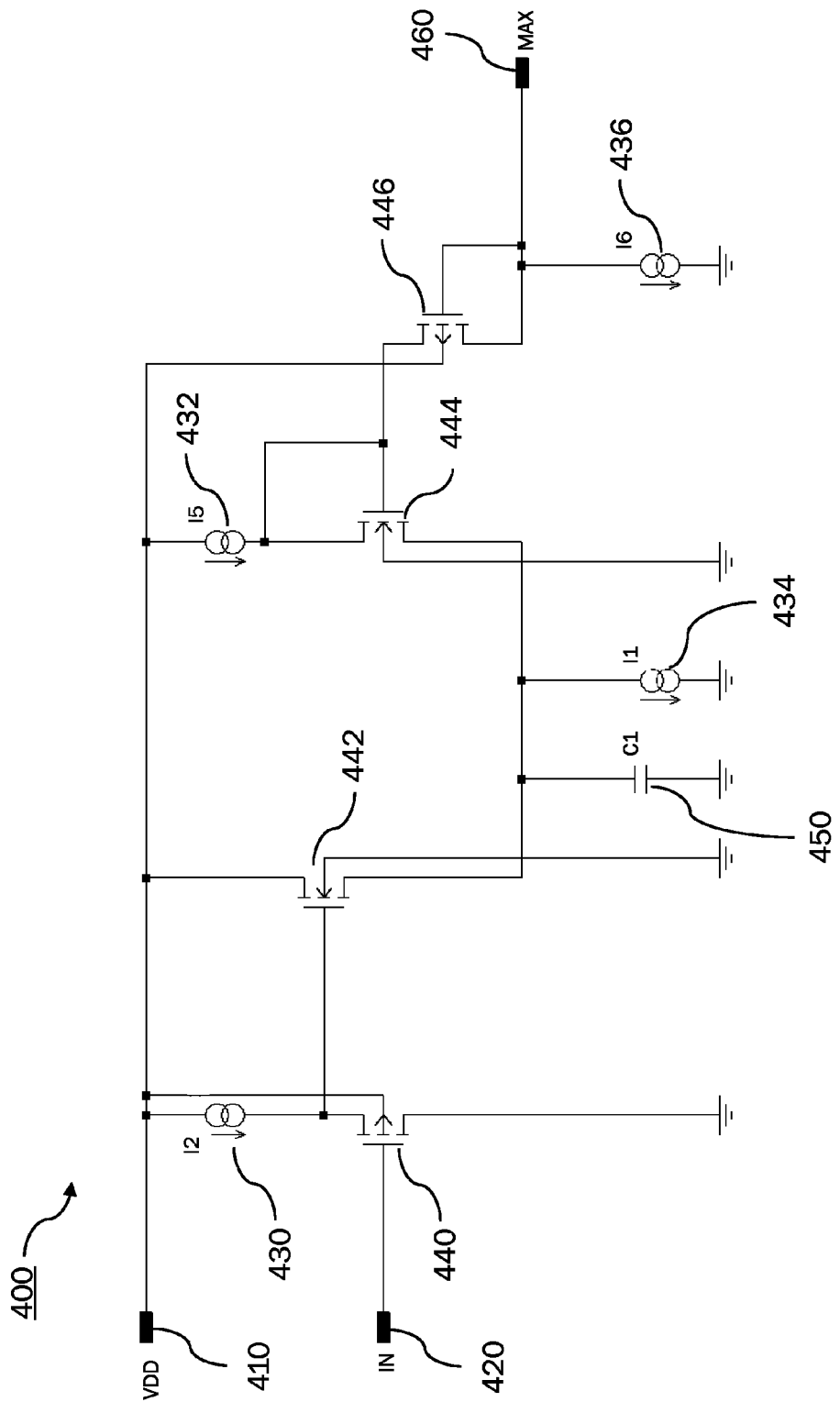
FIG. 4 schematically illustrates a component of the link failure detection block of FIG. 3.
Figure 6:
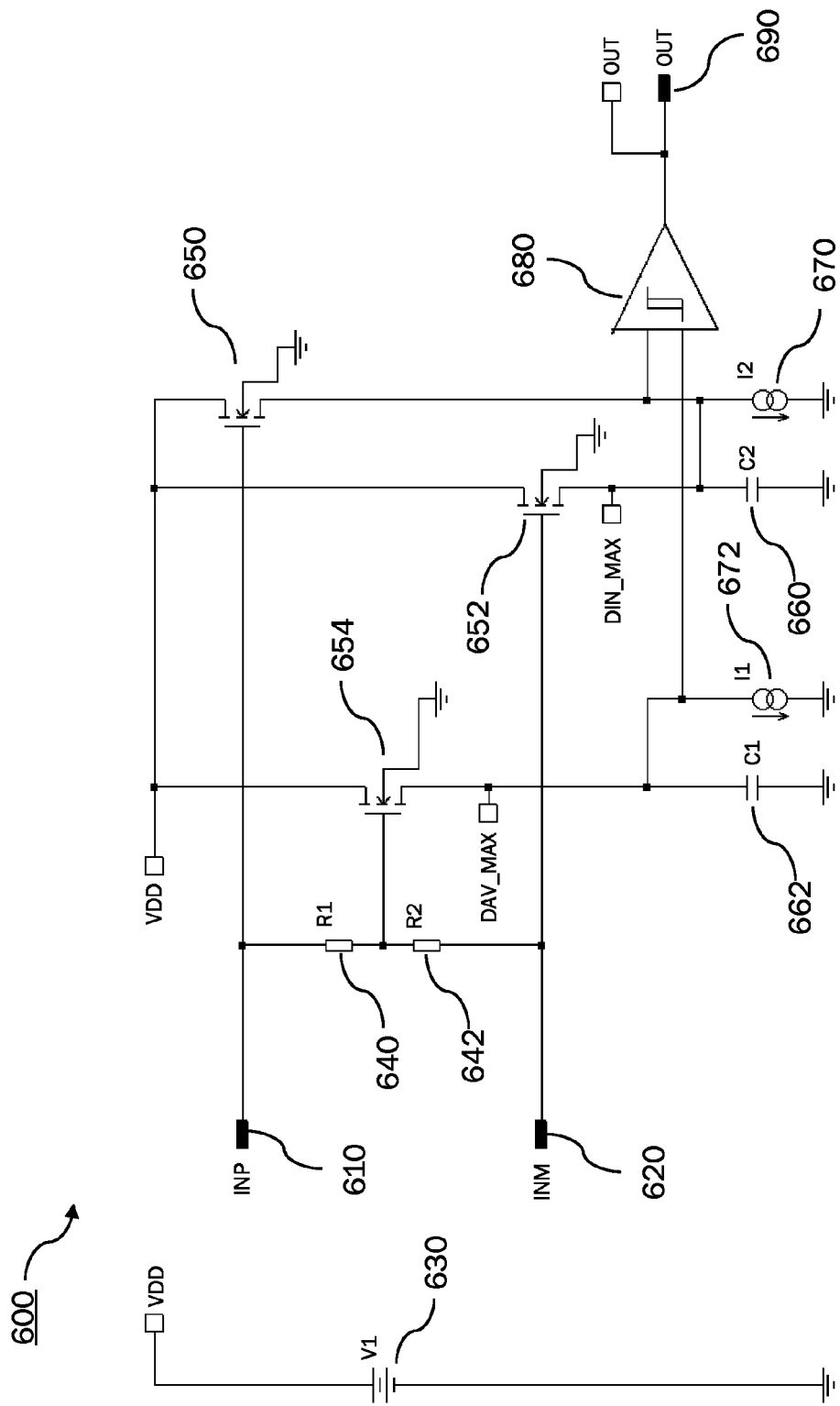
FIG. 6 schematically illustrates another link failure detection block comprised by the implementation of FIG. 1.

The first link failure detection block 600 may be implemented both by digital signal processing means, e.g. after A/D conversion of the input signals, or by analog circuitry. FIG. 6 shows an example for an implementation of the first link failure detection block 600 by analog circuitry. Although the below description of FIG. 6 relates to a specific implementation of the first link failure detection block 600 by analog circuitry, reference will nevertheless be made to the first link failure detection block 600, for reasons of conciseness, without intended limitation. In FIG. 6, the signal amplitude of each of the positive and negative input signals may be determined with the aid of a structure corresponding to maximum signal peak detector 400 that is illustrated in FIG. 4.

In FIG. 6, the first link failure detection block 600 comprises a first input port (input node) 610, a second input port (input node) 620, a voltage source 630 supplying a voltage VDD, first and second resistors (resistance elements) 640, 642, first to third transistors (transistor elements) 650, 652, 654, first and second capacitors (capacitance elements) 660, 662, first and second constant current sources 670, 672, a Schmitt trigger (a comparator applying a hysteresis) 680 and an output port (output node) 690. Therein, the first to third transistors 650, 652, 654 may be enhanced-mode NMOS transistors, for example. The first and second constant current sources 670, 672 are configured to source bias currents $I_1$, $I_2$, respectively, that also function as leakage currents to the charge stored in the capacitors 660 and 662 respectively. The first and second capacitors 660, 662 have capacitances $C_1$, $C_2$, respectively. The first and second resistors 640, 642 have substantially equal resistances.

The gate terminal of the first transistor 650 is connected to the first input port 610, the voltage VDD is supplied to the source terminal, and the drain terminal is connected to ground via a parallel connection of the first capacitor 660 and the first constant current source 670. The gate terminal of the second transistor 652 is connected to the second input port 620, the voltage VDD is supplied to the source terminal, and the drain terminal is connected to ground via the parallel connection of the first capacitor 660 and the first constant current source 670. A series connection of the first and second resistors 640, 642 is connected between the first and second input ports 610, 620. The gate terminal of the third transistor 654 is connected to a node between the first and second resistors 640, 642, the voltage VDD is supplied to the source terminal, and the drain terminal is connected to ground via a parallel connection of the second capacitor 662 and the second constant current source 672.

The signals INP and INM that enter the first link failure detection block 600 through the first and second input ports 610, 620 may correspond to signals that have been differentially amplified by the front-end amplifier 130 by a factor G with the common-mode removed. However, amplification and removal of the common mode by the front-end amplifier 130 is not strictly necessary. That is, the signals INP and INM may also correspond to the first and second signals, respectively.

The differential signal amplitude is found by determining the peak amplitude of the differential signal. One way to determine the peak amplitude of the differential signal is to measure (determine) the difference between the peak amplitude of INP or INM, whichever is largest, and the peak amplitude of the common-mode of INP and INM. Therein, the term peak value of a quantity is understood to relate to the maximum value over time that is attained by the respective quantity, wherein the determination of the peak value may relate to a predetermined period of time or a moving time window of predetermined length, as described above. According to an alternative, the differential signal at the first and second input ports 610, 620 could be converted to a single-ended signal and the peak voltage thereof could be determined.

The first link failure detection block 600 operates by charging the first capacitor 660 for input voltages that are larger than the present voltage on the first capacitor 660 and leaking a small current from the first capacitor 660 by means of the first current source 670 such that adjustments to smaller input voltages can be made. If the voltage level of the first signal (first voltage level) at the first input port 610 is above the voltage of the first capacitor 660 (plus a possible threshold voltage of the first transistor 650), a source-drain current may flow through the first transistor 650 and the first capacitor 660 is charged by the voltage VDD. The first capacitor 660 is also charged by the voltage VDD if the voltage level of the second signal (second voltage level) at the second input port 620 is above the voltage across/on the first capacitor 660 (plus a possible threshold voltage of the first transistor 650). At the same time, the first capacitor 660 is discharged by the leakage current $I_1$ sourced by the first constant current source 670. The differential equation for the voltage $V_1$ on the first capacitor 660 is therefore given by $$\frac{dV_1}{dt} = -\frac{I_1}{C_1} + \frac{I_0}{C_1} f(V_{in} - V_1), \qquad (3)$$

where the input voltage $V_{in}$ is either one of the first and second voltage levels, $I_0$ is the charge current (source-drain current of first transistor 650) depending on VDD, and f(x) is a trans-linear function (i.e. a function having a gradient depending on a positive power of x) depending on characteristics of the first transistor 650. Specific examples for f(x) include $$f(x) = \begin{Bmatrix} x^2, x > 0 \\ 0, x \le 0 \end{Bmatrix} \text{ or } f(x) = \begin{Bmatrix} e^x, x > 0 \\ 0, x \le 0 \end{Bmatrix}. \qquad (4)$$

Thus, for appropriate choice of the involved parameters, the first capacitor 660 stores a voltage corresponding to a larger one of the peak voltage level of the first signal (or the amplified first signal) and the peak voltage level of the second signal (or the amplified second signal), i.e. a voltage corresponding to a larger one of a maximum voltage level over time attained by the first signal (or the amplified first signal) and a maximum voltage level over time of the second signal (or the amplified second signal). It is to be noted that the leakage current $I_1$ allows adjustment to the input voltage over a time $\tau = V_1 C_1 / I_1$, i.e. time filtering of the input signal over this period of time.

Further, the second capacitor 662 is charged for input voltages larger than the present voltage on the second capacitor 662, and a small current is leaked from the second capacitor 622 by means of the second current source 672 such that adjustments to smaller input voltages can be made. If the intermediate voltage level of the first signal and second signal (intermediate voltage level) at the node between the first resistor 640 and the second resistor 642 is above the voltage on the second capacitor 662 (plus a possible threshold voltage of the third transistor 654), a source-drain current may flow through the third transistor 654 and the second capacitor 662 is charged by the voltage VDD. At the same time, the second capacitor 662 is discharged by the leakage current $I_2$ sourced by the second constant current source 672. The differential equation for the voltage $V_2$ on the second capacitor 662 is therefore given by $$\frac{dV_2}{dt} = -\frac{I_2}{C_2} + \frac{I_0}{C_2} f(V_{in} - V_2), \quad (5)$$

where the input voltage $V_{in}$ is the voltage at the node between the first resistor 640 and the second resistor 642, $I_0$ is the charge current (source-drain current of third transistor 654) depending on VDD, and f(x) is a trans-linear function depending on characteristics of the third transistor 654. The specific examples for f(x) given in equation (4) also apply here.

The voltage $V_1$ on the first capacitor 660 and the voltage $V_2$ on the second capacitor 662 are fed to the comparator 680, which applies a hysteresis corresponding to a minimum required amplitude $A_{diff,min}$ for the differential amplitude. Thus, the first link failure detection block 600 determines the peak amplitude of INP and INM given by equation (1), and subtracts therefrom the peak amplitude of the maximum of the common-mode of INP and INM given by equation (2). The obtained difference is the differential signal amplitude $A_{diff}$, $$A_{diff} = \max(\max_{t \in T}(V_{INP}(t)), \max_{t \in T}(V_{INM}(t))) - \max_{t \in T}\left(\frac{V_{INP}(t) + V_{INM}(t)}{2}\right). \quad (6)$$

The first error flag (first failure flag) LOWAMP will be set if the amplitude $A_{diff}$ is less than the minimum amplitude $A_{diff,min}$, $$\text{LOWAMP} = \Theta(A_{diff,min} - A_{diff}), \quad (7)$$

where θ(x) is the step function (Heaviside function).

Figure 10:
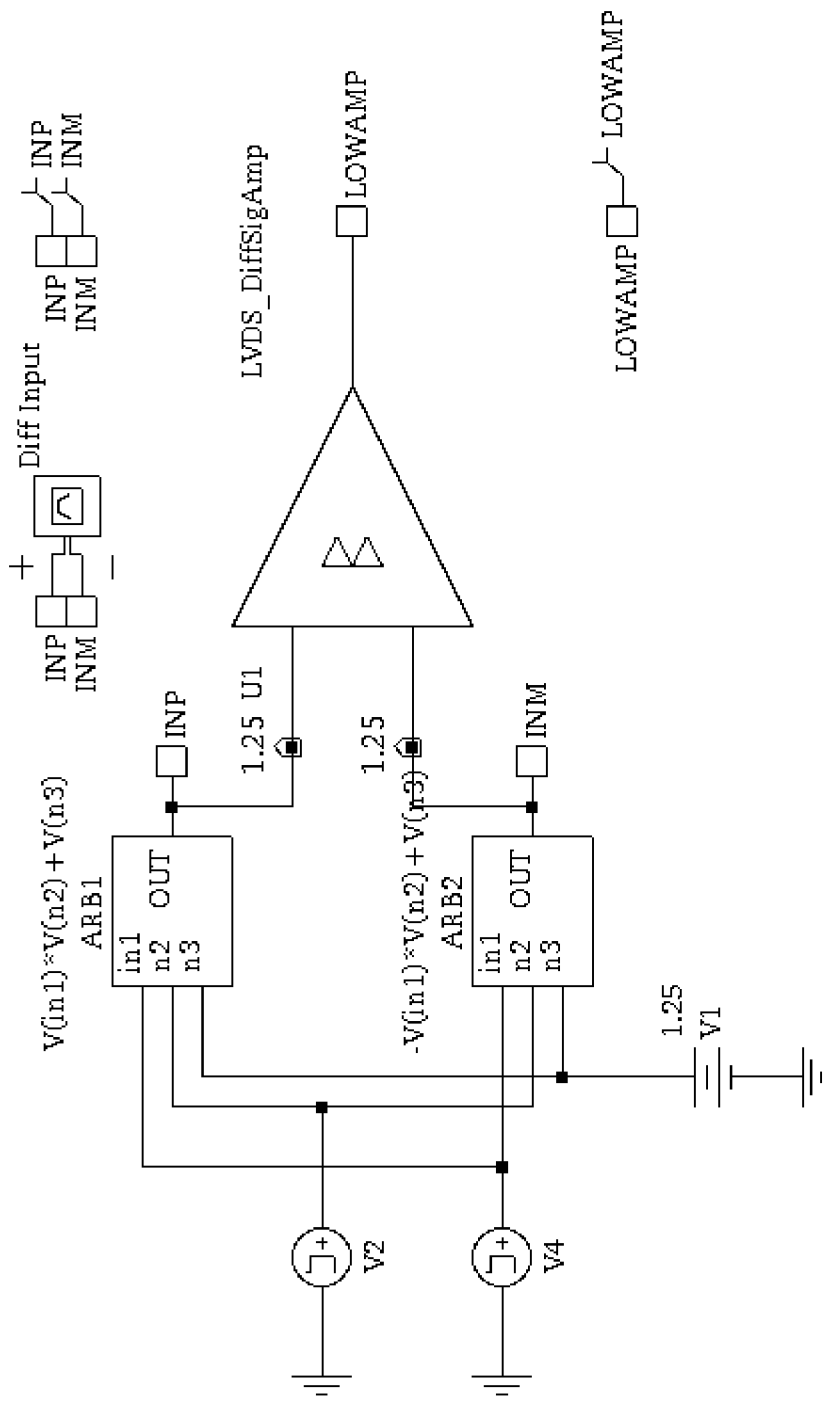
FIG. 10 schematically illustrates a test bench for testing the link failure detection block of FIG. 6.
Figure 14:
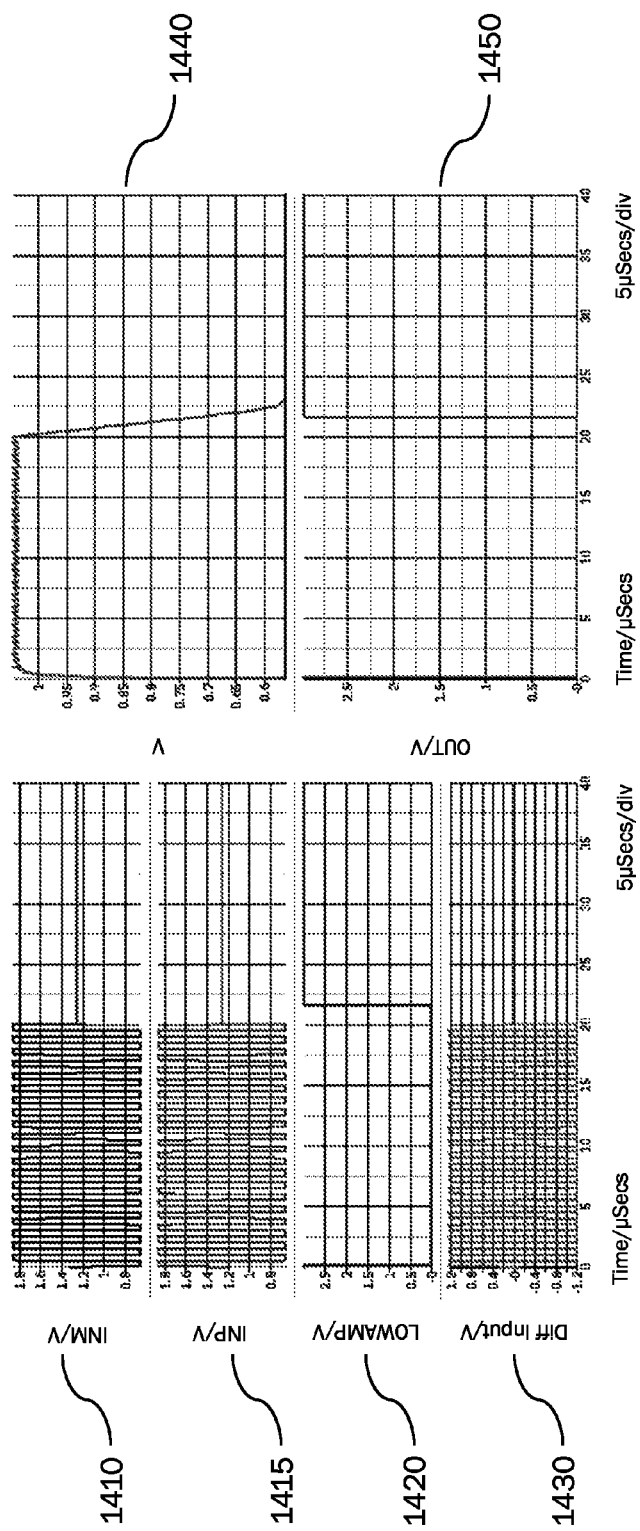
FIG. 14 shows a simulation result for the link failure detection block of FIG. 6.

Simulation results for the first link failure detection block 600 will now be described with reference to FIG. 10 and FIG. 14. FIG. 10 shows a test bench for testing the first link failure detection block 600, and respective simulation results are shown in FIG. 14. The test bench generates the LVDS signals coming out of the low-noise amplifier 130, which is assumed to have a gain of 4 for the purposes of the simulation, without intended limitation. Waveforms from the top of the test bench are shown in the left column (grids 1410, 1415, 1420, 1430) and waveforms output by the first link failure detection block 600 are shown in the right column (grids 1440, 1450). The maximum signal of the average of the positive and negative signal (DAV_MAX, seen here constant at about 0.55V) and maximum difference signal (DIN_MAX) are shown in the top grid 1440 in the right column. The amplitude of the input signal to the first link failure detection block 600 is that of the LVDS signal multiplied by the gain of the low-noise amplifier 130. The simulation shows that for signals smaller than the required LVDS signal amplitude $A_{diff,min}$ (100 mV) a failure flag is raised (grid 1450). For instance, for a double short link failure, the signal amplitude will be minimal and this situation is identified by the first link failure detection block 600.

Differential Signal Strength Indicator

The output of the low-noise amplifier 130 in FIG. 1 is also routed to the second link failure detection block 700 (differential signal strength indicator). Alternatively, the differential input signal may be routed directly to the second link failure detection block 700.

As will be described below, the second link failure detection block 700 is capable of detecting single or double input situations. In the case of a single open input situation, the open circuit line is coupled to the transmitter via the termination resistor and will lag the signal on the connected line. The received differential input signal is a high-pass filtered signal of the transmitter that appears to peak at the signal transitions.

The second link failure detection block 700 obtains (e.g. determines) a third quantity depending on (e.g. being indicative of) a time-integrated value of an absolute value (modulus) of a difference between the instantaneous voltage level in the first signal line and the instantaneous voltage level in the second signal line. The second link failure detection block 700 determines whether or not link failure is present on the basis of the first to third quantities, and raises an appropriate error flag (described below) if the link failure is present. It is understood that the second link failure detection block 700, or more generally, the apparatus for detecting link failure according to the present invention, comprises appropriate means for accomplishing the above tasks, as well as for additional tasks described below. It is further understood that a method for detecting link failure according to the present invention comprises respective method steps.

If the voltage level of the positive signal that is input to the second link failure detection block 700 is denoted $V_{INP}$ and the voltage level of the negative signal that is input to the second link failure detection block 700 is denoted $V_{INM}$, the third quantity depends on (e.g. is indicative of) a time-integrated value of $|(V_{INP} - V_{INM})|$. In other words, the time derivative of the third quantity depends on $|(V_{INP} - V_{INM})|$. Therein, the second link failure detection block 700 may be configured to time-filter the third quantity over time.

The second link failure detection block 700 further determines the differential amplitude $A_{diff}$ as described above with reference to the first link failure detection block 600, e.g. by obtaining (e.g. determining) the first quantity and the second quantity. Alternatively, the differential amplitude $A_{diff}$ and/or the first quantity and the second quantity may be fed to the second link failure detection block 700 from outside (i.e. from an external source), e.g. from the first link failure detection block 600.

On the basis of the first to third quantities, the second link failure detection block 700 determines whether or not link failure has occurred and raises and outputs a respective second error flag LOWSTR 184 in case that the link failure has occurred. This determination may involve comparing the first quantity, the second quantity, and the third quantity. This determination may further involve determining a difference between the first quantity and the second quantity, and determining whether or not said difference is larger than a predetermined factor times the third quantity.

Put differently, the second link failure detection block 700 is configured to measure (determine) the differential signal amplitude (differential signal strength) over time. This represents a measure of for how long over time the differential signal remains above the minimum amplitude for reliable signal processing. In contrast to a peak detector that only records a respective peak value that is attained over time, the second link failure detection block 700 also takes into account the time the signal stays at the peak value or above a given threshold, such as the minimum amplitude for reliable signal processing. The longer the maximum signal value can be held, the larger the signal over noise ratio will be and correspondingly, the larger is the strength (power) of the differential signal. In case the differential signal strength is found to be weak, the second error flag LOWSTR is raised to indicate that the signal to noise ratio of the input signal is affected. In such a case the shape of the signal is rather spiky and does not correspond to the sinusoidal series of round lobes that is expected from a differential signal having good differential signal strength. Contrary to a peak detector, the second link failure detection block 700 is able to detect link failure even for such spiky differential signals for which the peak values of the respective voltage levels of the first and second signals are above a given threshold although the overall differential signal strength is insufficient.

Figure 7:
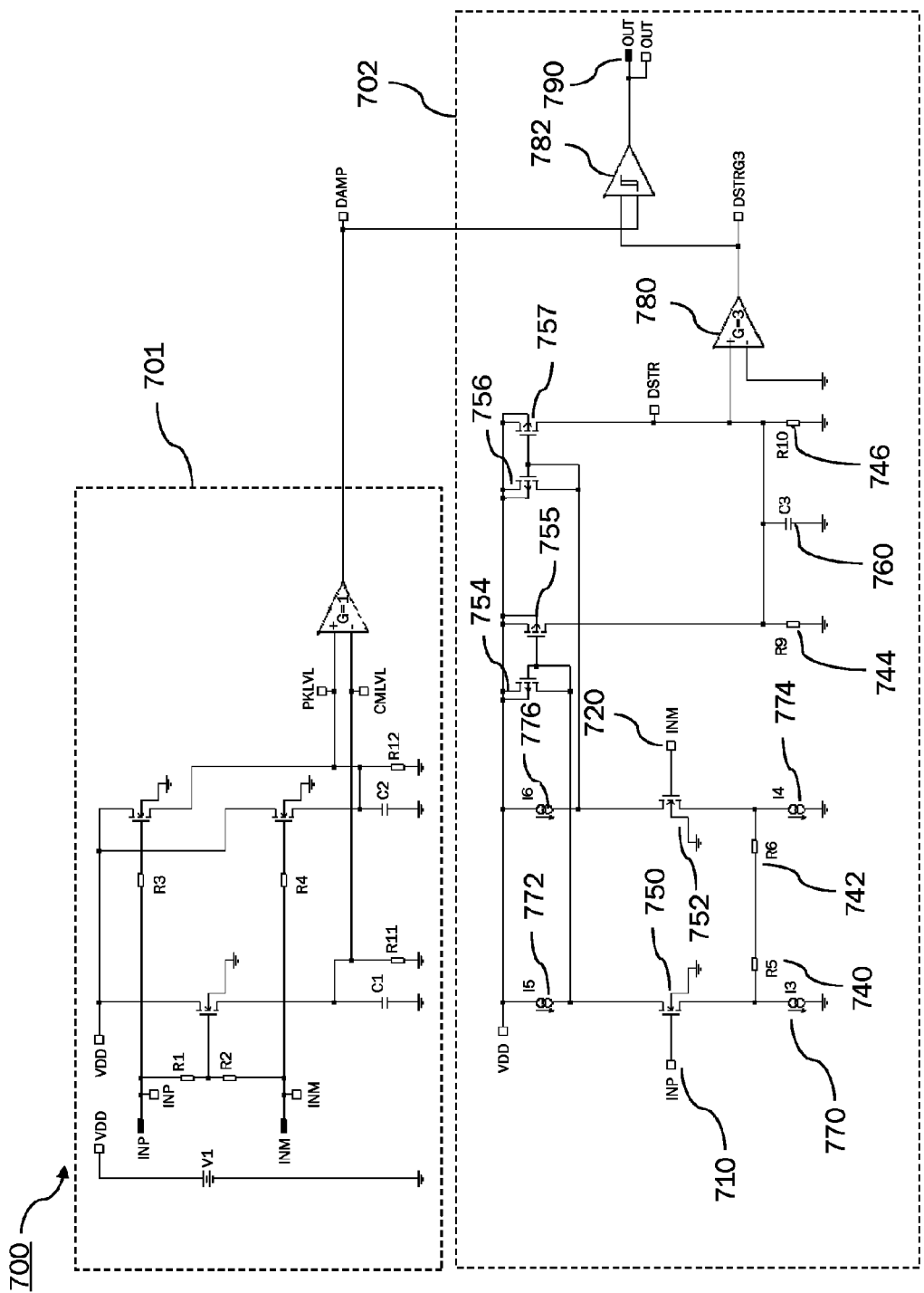
FIG. 7 schematically illustrates another link failure detection block comprised by the implementation of FIG. 1.

Also the second link failure detection block 700 may be implemented both by digital signal processing means, e.g. after A/D conversion of the input signals, or by analog circuitry. FIG. 7 shows an example for an implementation of the second link failure detection block 700 by analog circuitry. Although the below description of FIG. 7 relates to a specific implementation of the second link failure detection block 700 by analog circuitry, reference will nevertheless be made to the second link failure detection block 700, for reasons of conciseness, without intended limitation.

In FIG. 7, the second link failure detection block 700 comprises a first sub-block 701 and a second sub-block 702. The first sub-block 701 is identical in configuration to the first link failure detection block 600, with the exception that the Schmitt trigger 680 is replaced by a unit gain amplifier that outputs the difference between the first quantity and the second quantity, or more specifically, that outputs the differential signal amplitude $A_{diff}$ defined above. Alternatively, if the differential signal amplitude $A_{diff}$ is provided externally, it is not necessary for the second link failure detection block 700 to comprise the first sub-block 701.

The second sub-block 702 of the second link failure detection block 700 comprises a first input port (input node) 710, a second input port (input node) 720, a voltage source (not shown) supplying a voltage VDD, first to fourth resistors (resistance elements) 740, 742, 744, 746, first to sixth transistors (transistor elements) 750, 752, 754, 755, 756, 757, a capacitor (capacitance element) 760, first to fourth constant current sources 770, 772, 774, 776, an amplifier 780, a Schmitt trigger (a comparator applying a hysteresis) 782, and an output port (output node) 790. Therein, the first and second transistors 750, 752 may be enhanced-mode NMOS transistors, for example, and the third to sixth transistors 754, 755, 756, 757 may be enhanced-mode PMOS transistors, for example. The first to fourth constant current sources 770, 772, 774, 776 are configured to source currents $I_1$, $I_2$, $I_3$, $I_4$, respectively. The capacitor 760 has capacitance C. The first and second resistors 740, 742 have substantially equal resistances, and the third and fourth resistor 744, 746 have substantially equal resistances.

The gate terminal of the first transistor 750 is connected to the first input port 710, the voltage VDD is supplied to the source terminal, and the drain terminal is connected to ground via a parallel connection of the first constant current source 770 and a series connection of the first resistor 740, the second resistor 742, and the third constant current source 774. The second constant current source 772 is connected between the drain terminal of the first transistor 750 and the voltage VDD. The gate terminal of the second transistor 752 is connected to the second input port 720, the voltage VDD is supplied to the source terminal, and the drain terminal is connected to ground via a parallel connection of the third constant current source 774 and a series connection of the first resistor 740, the second resistor 742, and the first constant current source 770. The fourth constant current source 776 is connected between the drain terminal of the second transistor 752 and the voltage VDD. The gate terminals of the third and fourth transistors 754, 755 and the drain terminal of the third transistor 754 are respectively connected to a node between the second constant current source 772 and the drain terminal of the first transistor 750. The gate terminals of the fifth and sixth transistors 756, 757 and the drain terminal of the fifth transistor 756 are respectively connected to a node between the fourth constant current source 776 and the drain terminal of the second transistor 752. The voltage VDD is supplied to the source terminals of the third to sixth transistors 754, 755, 756, 757. The drain terminal of the fourth transistor 755 is connected to ground via a parallel connection of the third resistor 744 and a parallel connection of the capacitor 760 and the fourth resistor 746. The drain terminal of the sixth transistor 757 is connected to ground via a parallel connection of the fourth resistor 746 and a parallel connection of the capacitor 760 and the third resistor 744. The voltage V across the capacitor 760 is supplied to the amplifier 780, the other port of which is grounded. The comparator 780 may have an amplification gain $M_F$ greater than one. In a specific example, $M_F=3$ is chosen. The output of the amplifier 780 and the output of the first sub-block (or alternatively, the externally provided difference between the first and second quantities, i.e. $A_{diff}$) are fed to the Schmitt trigger 782 (which may also be replaced by a simple comparator).

The signals INP and INM that enter (the second sub-block 702 of) the second link failure detection block 700 through the first and second input ports 710, 720 may correspond to signals that have been differentially amplified by the front-end amplifier 130 by a factor G with the common-mode removed. However, amplification and removal of the common mode by the front-end amplifier 130 is not strictly necessary. That is, the signals INP and INM may also correspond to the first and second signals, respectively. Incidentally, the same holds true for the signals entering the first sub-block 701.

The differential signal strength is found by determining the average of the absolute value (modulus) of the area under the differential voltage across INP and INM over time. With the above configuration of the second sub-block 702, the absolute voltage of the differential voltage $V_{INP}-V_{INM}$ is converted with scale factor $R_L/R$ across the capacitor 760 for averaging. The time dependence of the voltage $V=A_{strength}$ across the capacitor 760 is given by $$\frac{dV}{dt} = -\frac{V}{R_L C} + \frac{|V_{INP}-V_{INM}|}{RC}, \qquad (8)$$

where R is the differential voltage amplitude-to-current conversion factor, and $R_L$ is the resistance normalization factor. Accordingly, the voltage $V=A_{strength}$ across the capacitor 760 (differential strength voltage) depends on a time-integrated value of a difference between the instantaneous voltage level in the first signal line and the instantaneous voltage level in the second signal line and is a measure of the average of the absolute value of the area under the differential voltage across INP and INM over time.

By comparing the differential signal strength voltage $V=A_{strength}$ with the differential signal amplitude $A_{diff}$ the failure condition for a low strength signal can be identified even when the input amplitude is large, but the strength is low. The second error flag (second failure flag) LOWSTR will be raised (by the Schmitt trigger 782) if the differential strength voltage $V=A_{strength}$ is smaller than a given fraction $1/M_F$ of the differential signal amplitude $A_{diff}$, that is $$LOWSTR=\Theta(A_{diff}-M_F A_{strength}). \qquad (9)$$

Without intended limitation, a reasonable choice for the multiplication factor $M_F$ (applied by the comparator 780) is three. For instance, the multiplication factor $M_F$ may be between 2 and 4.

Put differently, the second link failure detection block 700 measures (determines) the average—instead of the peak—of the absolute value of the amplitude over time and compares it to the maximum peak amplitude. If this average ($A_{strength}$) is smaller than a given fraction $1/M_F$ of the maximum peak amplitude ($A_{diff}$), an error is flagged since this conditions is indicative of significant signal distortion.

Figure 11:
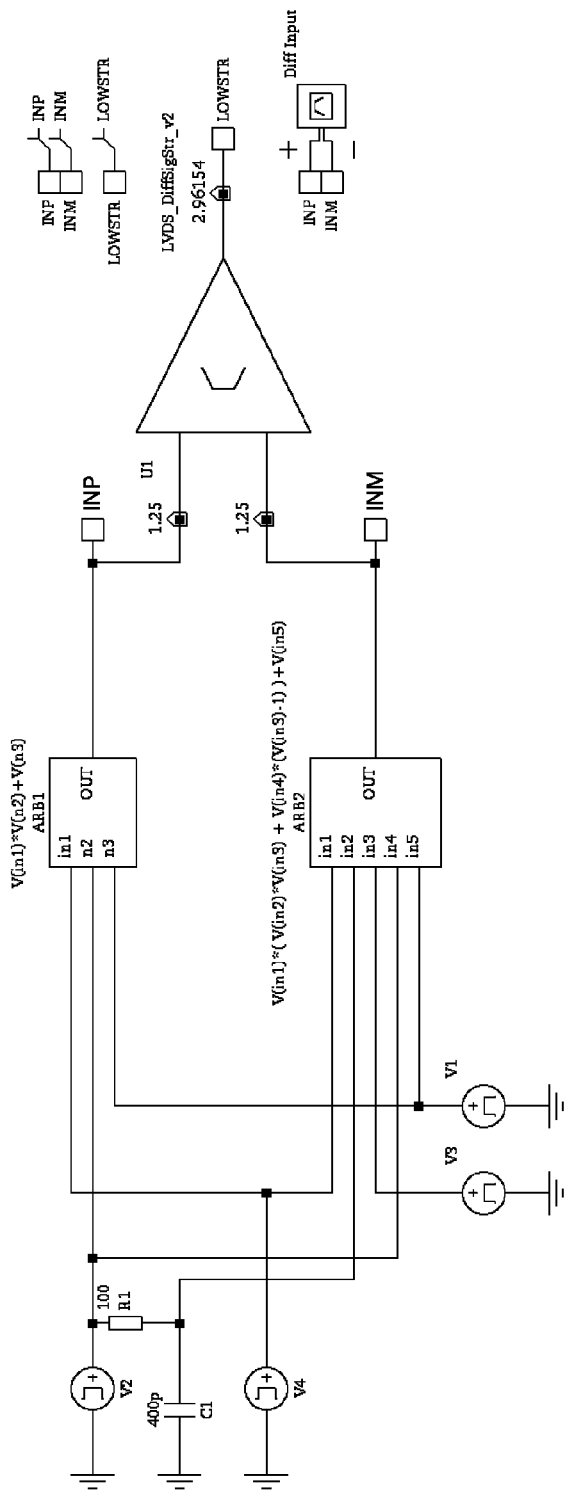
FIG. 11 schematically illustrates a test bench for testing the link failure detection block of FIG. 7.

Simulation results for the second link failure detection block 700 will now be described with reference to FIG. 11 and FIG. 15. FIG. 11 shows a test bench for testing the second link failure detection block 700, and respective simulation results are shown in FIG. 15A and FIG. 15B. The test bench generates the LVDS signals coming out of the low-noise amplifier 130 in FIG. 1, which is assumed to have a gain of 4 for the purposes of the simulation, without intended limitation.

Figure 15A:
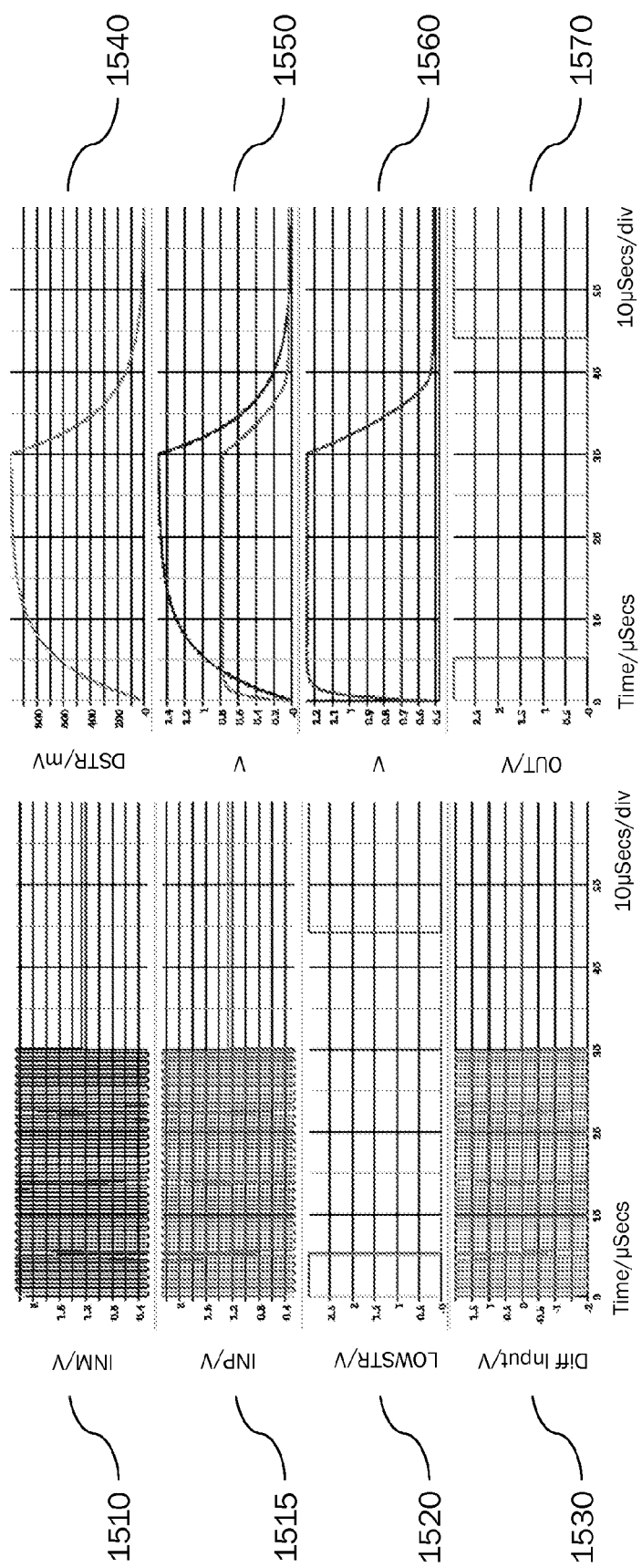
FIG. 15A and FIG. 15B show simulation results for the link failure detection block of FIG. 7.

For the first simulation illustrated in FIG. 15A, the test bench generates the LVDS signal as it would come out of the low-noise amplifier 130. Waveforms from the top of the test bench are shown in the left column (grids 1510, 1515, 1520, 1530) and waveforms from the second link failure detection block 700 are shown in the right column (grids 1540, 1550, 1560, 1570). In the right column, the top grid 1540 displays the signal strength (DSTR), the second grid 1550 shows the signal strength multiplied by a factor of 1.5 (upper curve) and the maximum peak amplitude of the signal (DAMP, lower curve), the third grid 1560 depicts the maximum common mode level (CMLVL, upper curve) and the maximum differential peak level (PKLVL, lower curve), and the bottom grid 1570 shows the low signal strength indicator (OUT or LOWSTR). For the signal case illustrated in FIG. 15A, a full signal is present for the first 30 μs. After 30 μs the signal becomes zero, which the signal strength indicator notices and which is flagged as low signal strength at about 14 μs after input signal loss.

Figure 15B:
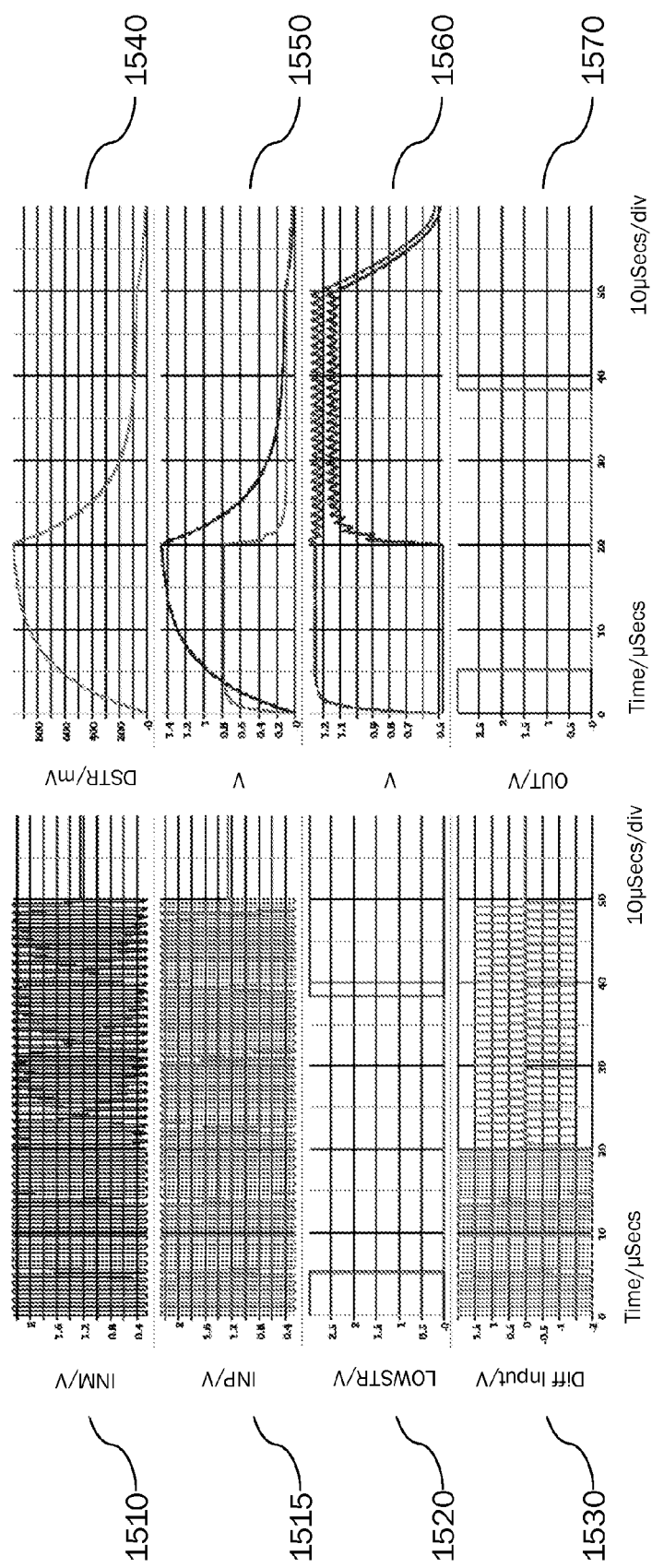

For the second simulation illustrated in FIG. 15B, the test bench emulates an open circuit at the bottom (negative) terminal that leads to a high pass filtered signal. The waveforms shown in the left and right columns of FIG. 15B correspond to those of FIG. 15A. The open circuit at the bottom (negative) terminal is simulated to be present from 20 μs onwards. The differential signal (Diff Input) is seen to exceed 1.2V after the low-noise amplifier 130 and would thus represent a signal larger than 300 mV at the LVDS input receiver terminal. While this signal would have the required amplitude and balance to pass as a valid differential signal, the second link failure detection block 700 notices the peaked nature (i.e. weak power) of the signal and flags the low signal strength.

For the special case of a double open failure in which self-oscillation occurs, the peaked nature of the input signal would be detected by the second link failure detection block 700.

Open Circuit Detector

The input differential signal is also routed to the third link failure detection block 800 (open circuit detector). The third link failure detection block 800 is configured to apply a periodic current ID to the first signal line and the second signal line (i.e. in the common mode), and, while the periodic current is applied, to obtain (e.g. determine) a fourth quantity depending on (e.g. being indicative of) an average value over time of an average (e.g. an arithmetic mean, or mid-point voltage) of the instantaneous voltage level in the first signal line and the instantaneous voltage level in the second signal line, as well as a fifth quantity depending on (e.g. being indicative of) an average value over time of averages (e.g. an arithmetic means, or mid-point voltages) of the instantaneous voltage level in the first signal line and the instantaneous voltage level in the second signal line obtained at predetermined timings. The predetermined timings may be those timings at which the periodic current attains one of its extremal values (i.e. its maximum value, or its minimum value). The third link failure detection block 800 determines whether or not link failure is present on the basis of the fourth quantity and the fifth quantity, and raises an appropriate error flag (described below) if the link failure is present. It is understood that the third link failure detection block 800, or more generally, the apparatus for detecting link failure according to the present invention, comprises appropriate means for accomplishing the above tasks, as well as for additional tasks described below. It is further understood that a method for detecting link failure according to the present invention comprises respective method steps.

If the voltage level of the positive signal that is input to the third link failure detection block 800 is denoted $V_{INP}$ and the voltage level of the negative signal that is input to the third link failure detection block 800 is denoted $V_{INM}$, the fourth quantity depends on (e.g. is indicative of)

$$\overline{\left(\frac{V_{INP}(t)+V_{INM}(t)}{2}\right)}, \qquad (10)$$

where $\overline{x}$ indicates an average over time (average value over time, or time average). The average over time preferably is taken for a period τ which is either a predetermined period of time with fixed boundaries in time, or a moving time window of given length (duration), e.g. including all timings less than a given period of time prior to a present timing. If the periodic current is set to be $I_D=I_{ARB}\cdot\cos(\omega t)$, the fifth quantity depends on (e.g. is indicative of)

$$\overline{\left(\left(\frac{V_{INP}(t)+V_{INM}(t)}{2}\right)\bigg|_{\omega t=2n\pi}\right)} \sim \frac{1}{N+1}\sum_{n=0}^{N}\left(\frac{V_{INP}(t)+V_{INM}(t)}{2}\right)\bigg|_{\omega t=2n\pi}, \qquad (11)$$

where $N=(\omega T)/(2\pi)$. Alternatively, samples could be taken at $\omega t=(2\pi+1)\cdot\pi$ instead of at $\omega t=2n\cdot\pi$. In general, samplings could be taken at timings that are spaced apart by the period of the periodic current, as long as the periodic current is different from zero at these timings. Yet more general, the samples could also be obtained by convoluting the average of the instantaneous voltage levels with a periodic sampling function that has the same period as the periodic current. Thus, in general, in can be said that the samples are obtained in accordance with the periodic current, or in accordance with the period of the periodic current. It is to be noted that if the periodic sampling function is chosen as a periodic sequence of δ-functions, the above sampling at predetermined timings would be obtained. It is further to be understood that the cosine function in the definition of $I_D=I_{ARB}\cdot\cos(\omega t)$ may be replaced by any other periodic function, such as a square function or a triangular function. In these cases, samples could be taken either at respective maximum function values, or at respective minimum function values.

On the basis of the fourth quantity and the fifth quantity, the third link failure detection block 800 determines whether or not link failure has occurred and raises and outputs a respective third error flag (third failure flag) OC 185. This determination may involve comparing the fourth quantity and the fifth quantity. This determination may further involve determining a (common mode) impedance $Z_{CM}$ of the conductor (communication link) formed by the first signal line and the second signal line on the basis of a difference between the fourth quantity and the fifth quantity and the amplitude $I_{ARB}$ of the periodic current $I_D$, and comparing said impedance to a predetermined threshold $Z_{CM,MAX}$ for the impedance value.

Put differently, the third link failure detection block 800 applies a very small amplitude and low frequency signal in common-mode on the input (i.e. to both signal lines in common mode) to measure the resulting common-mode voltage, which is a function of the common-mode resistance to the source. The common-mode voltage is measured synchronously with the applied periodic current, which can be, but is not limited to, either a low frequency square wave, sinusoid, triangular or other waveform or even a pseudo random low-frequency spread spectrum signal, as long as it does not influence the phase noise of the LVDS signal. Thereby, the third link failure detection block 800 is able to measure the transmitter common-mode output impedance of the source. If the actual common mode output impedance $Z_{CM}$ of the source is larger than a given threshold value $_{ZCM,MAX}$, the open circuit error flag (third error flag) OC is raised. It is to be noted that the probing signal does not compromise the phase noise of the LVDS signal received because of its low power, low frequency and common-mode nature.

Figure 8:
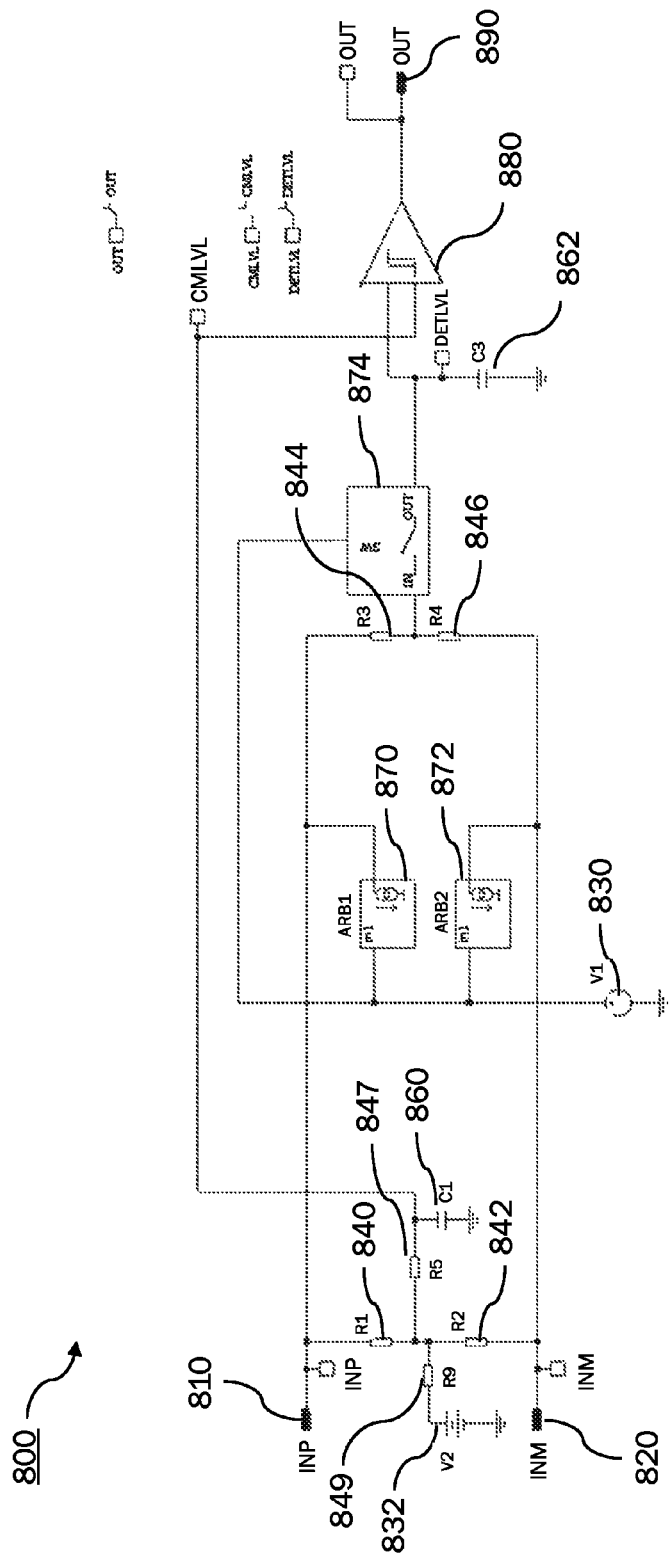
FIG. 8 schematically illustrates another link failure detection block comprised by the implementation of FIG. 1.

Also the third link failure detection block 800 may be implemented both by digital signal processing means, e.g. after A/D conversion of the input signals, or by analog circuitry. FIG. 8 shows an example for an implementation of the third link failure detection block 800 by analog circuitry. Although the below description of FIG. 8 relates to a specific implementation of the third link failure detection block 800 by analog circuitry, reference will nevertheless be made to the third link failure detection block 800, for reasons of conciseness, without intended limitation.

In FIG. 8, the third link failure detection block 800 comprises a first input port (input node) 810, a second input port (input node) 820, first and second voltage sources 830, 832 supplying voltages $V_1$, $V_2$, respectively, first to seventh resistors (resistance elements) 840, 842, 844, 846, 847, 848, 849, first and second capacitors (capacitance elements) 860, 862, first and second current sources 870, 872, a switch (switching element) 874, a Schmitt trigger (a comparator applying a hysteresis) 880 and an output port (output node) 890. Therein, the first and second current sources 870, 872 are configured to source currents $I_{D1}$, $I_{D2}$, respectively, with $I_{D1}=I_{D2}=I_{ARB}\cdot\cos(\omega t)$, where the cosine function is understood to be a non-limiting representation of possible waveform functions. The first and second capacitors 860, 862 have capacitances $C_1$, $C_2$, respectively. The first and second resistors 840, 842 have substantially equal resistances, and the third and fourth resistors 844, 846 have substantially equal resistances.

The first and second current sources 870, 872 are connected such as to be able to apply periodic currents $I_{D1}$, $I_{D2}$ to the first signal line through the first input port 810 and the second signal line through the second input port 820, respectively. It is to be noted that the first and second current sources 870, 872 may be replaced by a single current source that is connected to the first signal line and the second signal line. The first and second resistors 840, 842 are connected in series between the first and second input ports 810, 820. Likewise, the third and fourth resistors 844, 846 are connected in series between the first and second input ports 810, 820. The second voltage source 832 is connected to a node between the first and second resistors 840, 842 via the seventh resistor 849 and grounded on its other side. The first capacitor 860 is connected to the node between the first and second resistors 840, 842 via the fifth resistor 847 and grounded on its other side. The second capacitor 862 is connected to a node between the third and fourth resistors 844, 846 via the switch 874 and grounded on its other side. Since the resistance values of the first and second resistors 840, 842 are substantially equal, the voltage at the node between the first and second resistors 840, 842 corresponds to the mid-point voltage of the voltage levels in the first and second signal lines. Likewise, since the resistance values of the third and fourth resistors 844, 846 are substantially equal, the voltage at the node between the third and fourth resistors 844, 846 corresponds to the mid-point voltage of the voltage levels in the first and second signal lines. The voltage across the first capacitor 860 and the voltage across the second capacitor 862 are fed to the Schmitt trigger 880, the output of which is fed to the output port 890. The Schmitt trigger 880 outputs the third error flag OC if the difference between the aforementioned voltages is above a predetermined threshold value.

Configured as above, the third link failure detection block 800 operates by injecting a common mode current into the INP and INM ports (first and second input ports 810, 820) with zero average value at a low frequency such as not to influence the differential signaling. Two common-mode voltage detectors operate in the third link failure detection block 800: a first one to measure the long time average common-mode voltage $V_{CMLVL}=V_{AVG}$ that is insensitive to the injected common-mode current (since the injected common mode current has zero average value), the second one to measure the long time average common-mode voltage $V_{DETLVL}$ synchronously to the injected common-mode current. The difference between the two measured common-mode voltages gives an indication of the common-mode impedance attached to the INP and INM ports. When said common-mode impedance is larger than the specified threshold impedance $Z_{CM,MAX}$, the third error flag OC is set. Therein, it is assumed that the common-mode impedance is low at low frequencies due to a configuration of the transmitter circuit like the one discussed in "LVDS I/O Interface for GB/s-per-Pin Operation in 0.35-um CMOS", IEEE Journal of Solid State Circuits, vol. 36, NO. 4, April 2001.

Given that the resistance values $R_1$, $R_2$ of the first and second resistors 440, 442, respectively, are much smaller than the resistance values $R_5$, $R_9$ of the fifth and seventh resistors 847, 849, respectively, i.e. $R_1$, $R_2 \ll R_5$, $R_9$, the average common-mode voltage of ports INP and INM is found by averaging the mid-point voltage between the first and second resistors 840, 842 over time e.g. with a low pass filter implemented by the fifth resistor 847 and the first capacitor 860. Higher order low pass filters could be used if necessary. With sufficient filtering, the detected common-mode voltage $V_{CMLVL}$ across the first capacitor 860 is substantially equal to the average common-mode voltage $V_{AVG}$. The time derivative of the voltage $V_{CMLVL}$ is given by $$\frac{dV_{CMLVL}}{dt} = \frac{\frac{1}{2}(V_{INP} - V_{INM}) - V_{CMLVL}}{R_5 C_1}. \qquad (12)$$

The common-mode induced-voltage depends on the current $I_D$ with amplitude $I_{ARB}$ at radial frequency $\omega$ generated by the first and second current sources 870, 872, on the equivalent resistances $R_{CM,P}$ and $R_{CM,M}$ between the ports INP and INM and the first and second current sources 870, 872, respectively, and on the average common-mode voltage $V_{AVG}$ in accordance with $$\frac{V_{INP} + V_{INM}}{2} = V_{AVG} + I_{ARB}\cos(\omega t)\frac{R_{CM,P} + R_{CM,M}}{2}, \qquad (13)$$

assuming again, without intended limitation, a cosine function for the waveform function of the periodic current $I_D$. By sampling the above voltage at extremal values of the periodic current, e.g. at $\cos(\omega t)=1$ or alternatively at $\cos(\omega t)=-1$ onto the second capacitor 862 and filtering appropriately (not shown in FIG. 8), the detector voltage $V_{DETLVL}$ is obtained. Comparing this voltage $V_{DETLVL}$ to the average common-mode voltage $V_{CMLVL}=V_{AVG}$, the common-mode impedance can be determined by $$Z_{CM} = \frac{V_{DETLVL} - V_{CMLVL}}{I_{ARB}} = \frac{R_{CM,P} + R_{CM,M}}{2}. \qquad (14)$$

For values of the common mode impedance $Z_{CM}$ above the threshold $Z_{CM,MAX}$, the open circuit flag OC (third error flag) will be set, that is $$OC=\Theta(Z_{CM,MAX}-Z_{CM}). \qquad (15)$$

It is to be noted that instead of sampling the common mode voltage, the common mode voltage could alternatively also be convoluted with the $\cos(\omega t)$ signal (or the respective applicable periodic waveform function) in order to extract the common-mode impedance. It is further noted that the common mode voltage could also be sampled at timings for which the periodic current ID does not attain one of its extremal values, provided an appropriate correction factor is applied. The minimal requirement for the timings for sampling the common mode voltage is that said timings are spaced apart by the period of the periodic current ID, and that for said timings the periodic current ID is different from zero. In more general terms, as indicated above, the samples could also be obtained by convoluting the average of the instantaneous voltage levels with a periodic sampling function that has the same period as the periodic current.

Figure 12:
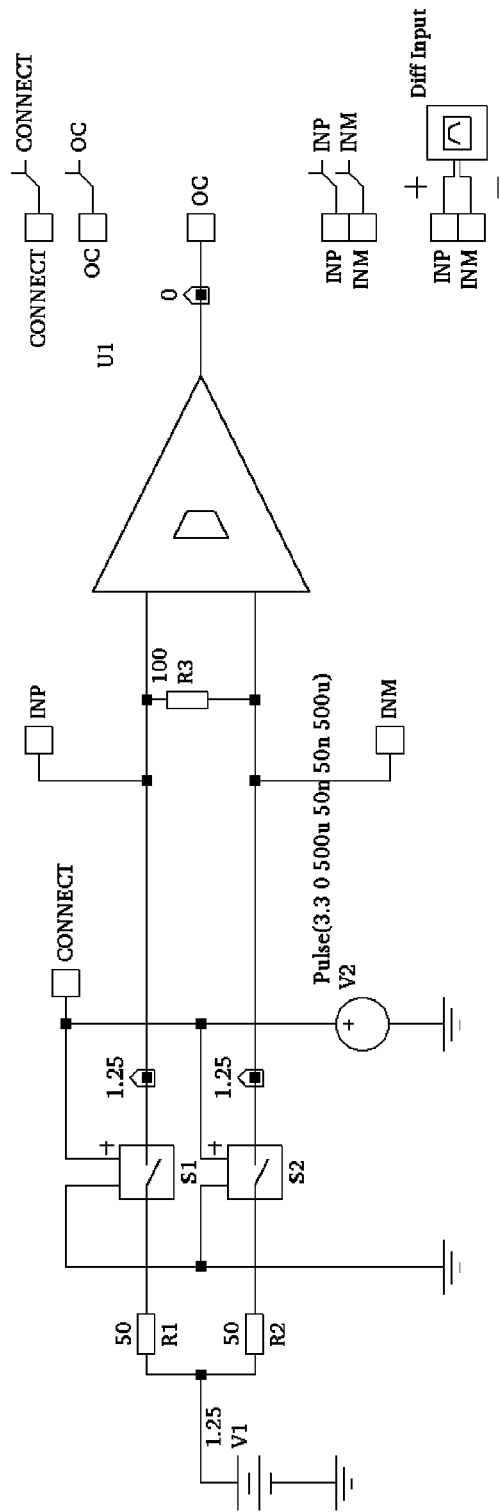
FIG. 12 schematically illustrates a test bench for testing the link failure detection block of FIG. 8.
Figure 16:
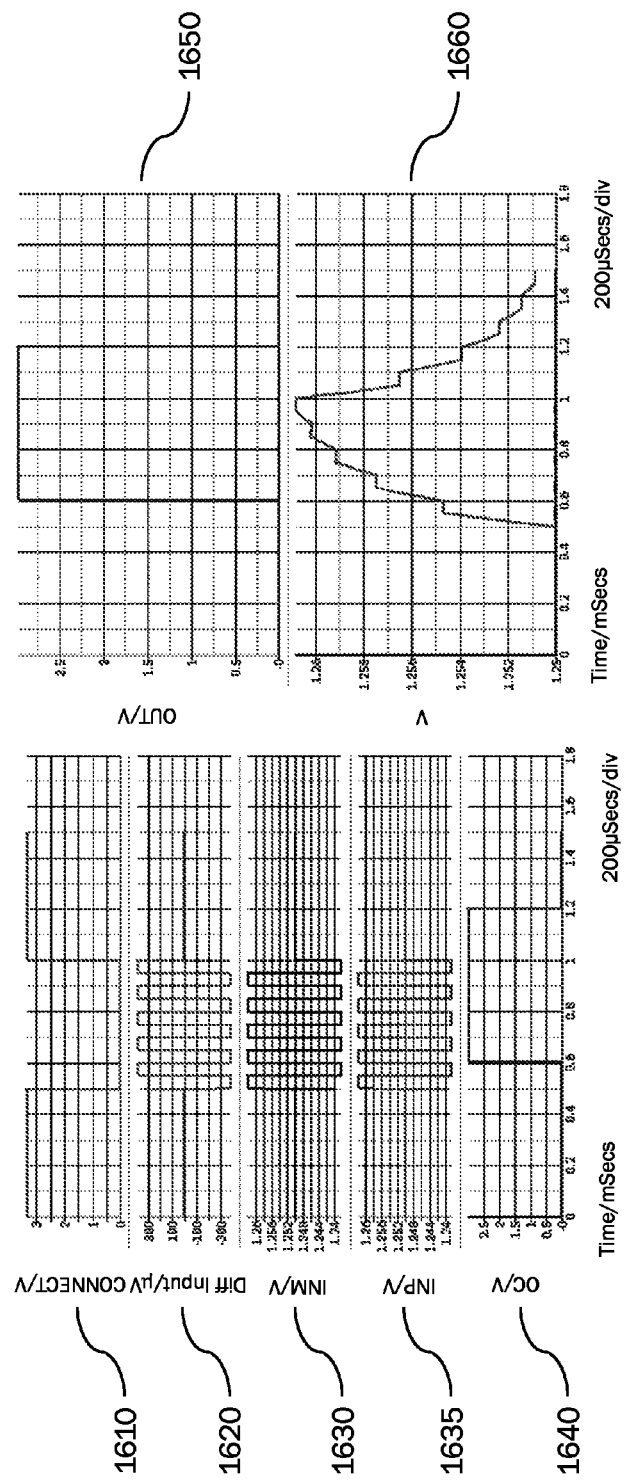
FIG. 16 shows a simulation result for the link failure detection block of FIG. 8.

Simulation results for the third link failure detection block 800 will now be described with reference to FIG. 12 and FIG. 16. FIG. 12 shows a test bench for testing the third link failure detection block 800, and respective simulation results are shown in FIG. 16. In FIG. 16, waveforms from the top of the test bench are shown in the left column (grids 1610, 1620, 1630, 1635, 1640) and waveforms from the second link failure detection block 700 are shown in the right column (grids 1650, 1660). The bottom grid 1660 in the right column displays the filtered common-mode signal (CMLVL, lower curve at about 1.25V) and the detector source input impedance signal (DETLVL, upper curve). From 500 µs to 1000 µs the inputs are disconnected from the source as indicated by the switch control signal (CONNECT). During the disconnection, a high source impedance is detected and the open circuit flag raised by the third link failure detection block 800.

For a double open circuit the common-mode impedance to the source is very large and results in a significant common-mode voltage swing, which above a determined level (in the current implementation 400 mV is taken) indicates an open circuit. The open circuit output flag (OC) is correspondingly raised. Further, with the increased sensitivity of the third link failure detection block 800 an open circuit at one or two terminals would also be detected even if the LVDS termination resistors would be connected to ground. An open circuit would change the common-mode impedance that would be indicative of the single and double open failure condition. The low operating frequency of the third link failure detection block 800 ensures that the impedance measurement is not affected adversely by the attached line capacitance.

As will be described below, an error will be flagged by the fourth link failure detection block 300 for the special case of a double open failure in which self-oscillation occurs. Depending on circumstances, larger pick-up signals may not be identified as erroneous by any of the first, second and fourth link failure detection blocks 600, 700, 300. Such an error situation is identified and flagged by the third link failure detection block 800.

Input Swing and Balance Detector

The input differential signal is also routed to the fourth link failure detection block 300 (input swing and balance detector). The fourth link failure detection block 300 is configured to obtain (e.g. determine) a sixth quantity depending on (e.g. being indicative of) a maximum value over time of a voltage level that is attained in one of the first signal line and the second signal line and a minimum value over time of the voltage level that is attained in the one of the first signal line and the second signal line. The fourth link failure detection block 300 determines whether or not link failure is present on the basis of the sixth quantity, and raises an appropriate error flag (described below) if the link failure is present. It is understood that the fourth link failure detection block 300, or more generally, the apparatus for detecting link failure according to the present invention, comprises appropriate means for accomplishing the above tasks, as well as for additional tasks described below. It is further understood that a method for detecting link failure according to the present invention comprises respective method steps.

If the voltage level of the positive signal that is input to the fourth link failure detection block 300 is denoted $V_{INP}$ and the voltage level of the negative signal that is input to the fourth link failure detection block 300 is denoted $V_{INM}$, the sixth quantity depends on (e.g. is indicative of) $\max_{t \in T}(V_{INP}(t))$ and $\min_{t \in T}(V_{INP}(t))$ if applied to the first (positive) signal line, i.e. to the first (positive) signal, and on $\max_{t \in T}(V_{INM}(t))$ and $\min_{t \in T}(V_{INM}(t))$ if applied to the second (negative) signal line, i.e. to the second (negative) signal.

More specifically, the sixth quantity depends on (e.g. is indicative of, or corresponds to) the difference $$A_{INP} = \max_{t \in T}(V_{INP}(t)) - \min_{t \in T}(V_{INP}(t)) \qquad (16)$$

in the former case, or on $$A_{INM} = \max_{t \in T}(V_{INM}(t)) - \min_{t \in T}(V_{INM}(t)) \qquad (17)$$

in the latter case, where τ is a predetermined period of time or a moving time window as described above.

The fourth link failure detection block 300 is configured to determine whether or not link failure has occurred on the basis of the determined sixth quantity and to raise and output a fourth error flag (fourth failure flag) STATICP 180 in the former case or STATICM 182 in the latter case, if the link failure has occurred. This determination may involve comparing the sixth quantity to a given threshold value.

The fourth link failure detection block 300 may be further configured to obtain (e.g. determine) a seventh quantity depending on (e.g. being indicative of) a maximum value over time of a voltage level that is attained in the other one of the first signal line and the second signal line and a minimum value over time of the voltage level that is attained in the other one of the first signal line and the second signal line.

If the sixth quantity applies to the first (positive signal), the seventh quantity depends on (e.g. is indicative of) $\max_{t \in T}(V_{INM}(t))$ and $\min_{t \in T}(V_{INM}(t))$, and otherwise, if the sixth quantity applies to the second (negative signal), on $\max_{t \in T}(V_{INP}(t))$ and $\min_{t \in T}(V_{INP}(t))$. More specifically, the seventh quantity depends on (e.g. is indicative of, or corresponds to) the difference $A_{INM}$ as given in equation (17) in the former case, and depends on (corresponds to) the difference $A_{INP}$ as given in equation (16) in the latter case.

Then, the fourth link failure detection block 300 is configured to determine whether or not link failure has occurred on the basis of the seventh quantity and raises and outputs a fifth error flag (fifth failure flag) STATICM in the former case or STATICP in the latter case, if the link failure has occurred. This determination may involve comparing the seventh quantity to a given threshold value. Further, the fourth link failure detection block 300 may be configured to determine whether or not link failure has occurred on the basis of the sixth quantity and the seventh quantity and to raise and output a sixth error flag (sixth failure flag) if the link failure has occurred. This determination may involve comparing the sixth quantity and the seventh quantity. This determination may further involve determining whether or not a ratio between the sixth quantity and the seventh quantity is within a given range.

In other words, the fourth link failure detection block 300 measures (determines) the input swing (voltage swing, input terminal voltage swing) with a peak detector, for each of the inputs INP, INM separately and compares the respective input swing to the minimum voltage level $A_{MIN}$ required for reliable transmission. The input swing for a signal is defined by the difference between the maximum voltage level over time that is attained by the signal and the minimum voltage level over time that is attained by the signal. A failure flag (one of the fourth and fifth error flags) is raised for each input signal if the respective input signal has reduced voltage swing (i.e. a voltage swing below the minimum voltage level $A_{MIN}$). These error flags will be referred to as STATICP for the positive signal and STATICM for the negative signal. In addition, the fourth link failure detection block 300 also compares the positive and negative input terminal voltage swings and detects an unbalance between them. A failure flag UNBAL (sixth error flag) is raised if the positive and negative input signals differ in signal amplitude (i.e. in voltage swing) by more than a given fraction, i.e. by more than a given factor $M_F$. For instance, $M_F$ may be chosen between 2 and 4, e.g. 3.

Figure 3:
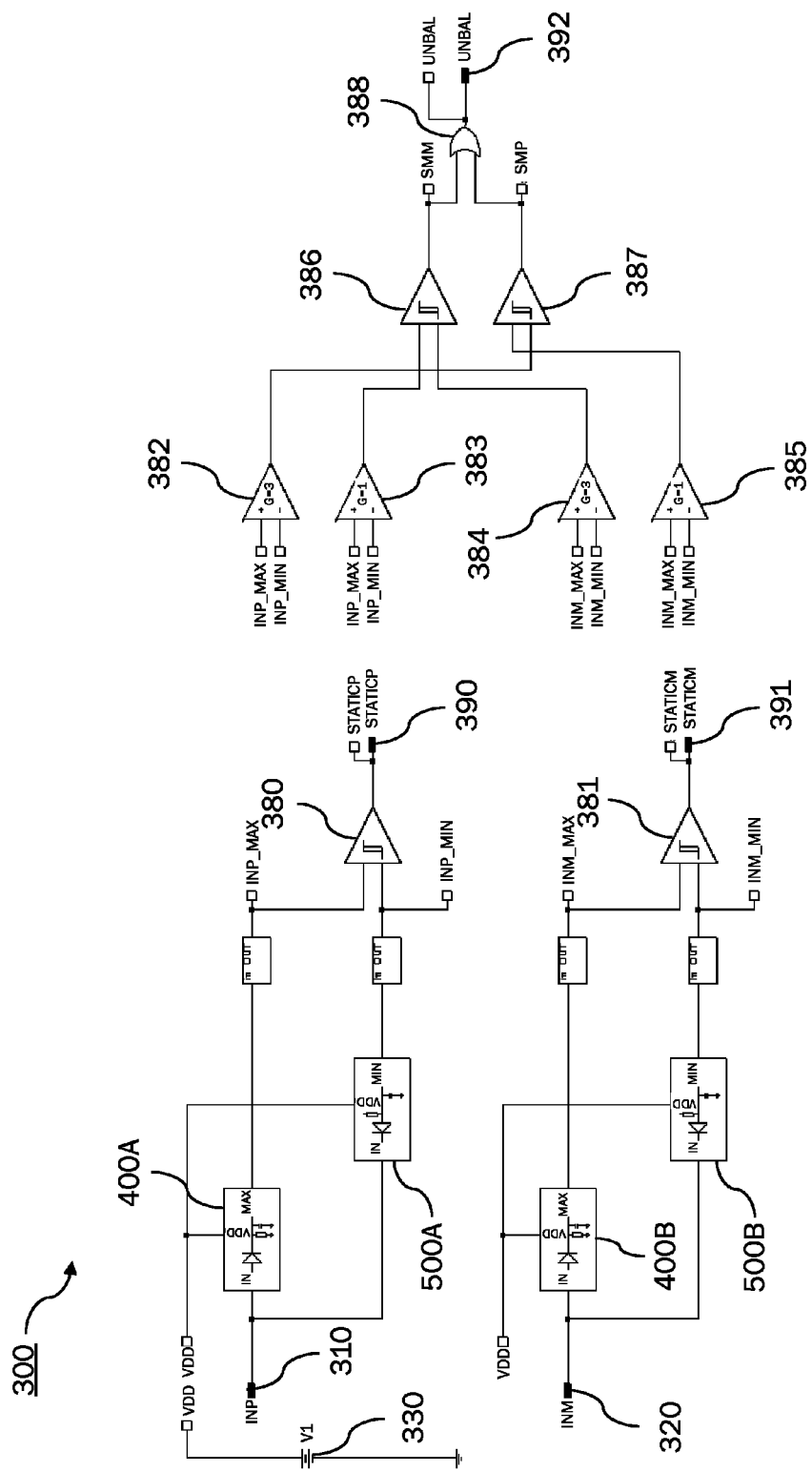
FIG. 3 schematically illustrates a link failure detection block comprised by the implementation of FIG. 1.

The fourth link failure detection block 300 may be implemented both by digital signal processing means, e.g. after A/D conversion of the input signals, or by analog circuitry. FIG. 3 shows an example for an implementation of the fourth link failure detection block 300 by analog circuitry. Although the below description of FIG. 3 relates to a specific implementation of the fourth link failure detection block 300 by analog circuitry, reference will nevertheless be made to the third fourth failure detection block 300, for reasons of conciseness, without intended limitation. As will be explained below, the signal amplitude of each of the positive and negative input signals is determined with the aid of maximum and minimum signal peak detectors 400, 500 that are shown in detail in FIG. 4 and FIG. 5, respectively.

Figure 5:
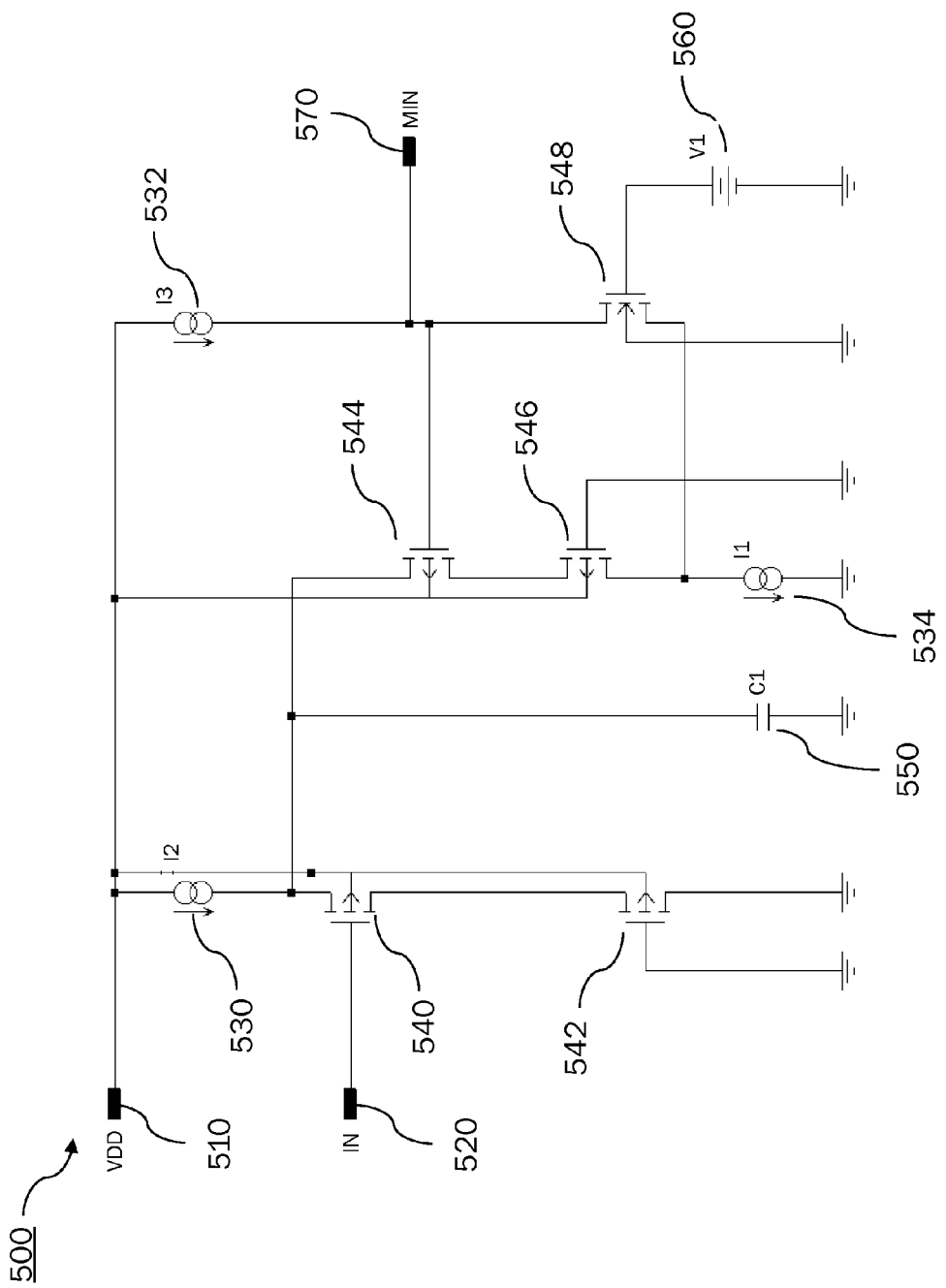
FIG. 5 schematically illustrates another component of the link failure detection block of FIG. 3.

In FIG. 3, the fourth link failure detection block 300 comprises a first input port (first node) 310, a second input port 320, a voltage source 330 supplying a voltage VDD, a first maximum signal peak amplitude detector block 400A, a second maximum signal peak amplitude detector block 400B, a first minimum signal peak amplitude detector block 500A, a second minimum signal peak amplitude detector block 500B, first to fourth Schmitt triggers (comparators applying a hysteresis) 380, 381, 386, 387, first to fourth amplifiers 382, 383, 384, 385, a logic OR-gate 388, and first to third output ports (first to third output nodes) 390, 391, 392. The first and second maximum signal peak amplitude detector blocks 400A, 400B are identical in configuration and illustrated in more detail in FIG. 4. The first and second minimum signal peak amplitude detector blocks 500A, 500B are identical in configuration and illustrated in more detail in FIG. 5. The first and second maximum signal peak amplitude detector blocks 400A, 400B and the first and second minimum signal peak amplitude detector blocks 500A, 500B may be commonly referred to as peak detectors. Detection of peak values by the peak detectors proceeds similarly to the situation described above with reference to the first link failure detection block 600, so that a detailed description of the circuitry in FIG. 4 and FIG. 5 is omitted.

The first input signal (INP) is fed to the first maximum signal peak amplitude detector block 400A and to the first minimum signal peak amplitude detector block 500A. The second input signal (INM) is fed to the second maximum signal peak amplitude detector block 400B and to the second minimum signal peak amplitude detector block 500B. Each maximum signal peak amplitude detector block periodically, say once per time period τ, copies the maximum observed value of the input voltage onto a capacitor. After the given time τ the voltage across the voltage across the capacitor is reset to allow for a new maximum input value to be copied onto the capacitor. Instead of resetting the capacitor value periodically once per period τ, the voltage across the capacitor can be allowed to decay exponentially to zero with time constant τ and the capacitor can be charged any time the input voltage is larger than the voltage across the capacitor. For such a continuously operating peak detector the time derivative of the voltage across the capacitor can be mathematically described by $$\frac{dV}{dt} = -\frac{I_R}{C} + \frac{I_0}{C} f(V_{in} - V), \qquad (18)$$

where the input voltage $V_{in}$ is either one of the first and second voltage levels, $I_0$ is the charge current depending on VDD, $I_R$ is the parallel current discharging the capacitor (alternatively, also a parallel resistor could be used), and f(x) is a trans-linear function as described above. Specific examples for f(x) include $$f(x) = \begin{Bmatrix} x^2, x > 0 \\ 0, x \le 0 \end{Bmatrix} \text{ or } f(x) = \begin{Bmatrix} e^x, x > 0 \\ 0, x \le 0 \end{Bmatrix}. \quad (19)$$

The first term in Eq. (18) ensures that the node voltage does always return to zero within time $\tau=VC/I_R$ (for the case of a parallel resistor, the time constant would have been $\tau=RC$). The second term in Eq. (18) ensures that the output voltage always becomes equal to the input voltage $V_{in}$, since the trans-linear second term is always larger than the first term. In the present configuration, the voltage on the capacitor naturally decays to zero unless the input voltage is larger than the present voltage on the capacitor. In the latter case, the voltage on the capacitor increases to that of the input voltage with a rate determined by f(x). Thus the capacitor voltage V determines the maximum, i.e. peak, input voltage level $V_{max}$ of the input voltage.

The circuit illustrated in FIG. 4 tracks the positive peak of the input voltage, while the circuit illustrated in FIG. 5 tracks the negative peak of the input voltage. For the latter case the signs on the right hand side of Eq. (18) are reversed.

The amplitudes on the inputs INP and INM are given Eq. (16) and Eq. (17). In these equations, $\max_{t \in T}(V_{INP}(t))$ and $\max_{t \in T}(V_{INM}(t))$ are the positive peaks of the first and second input signals obtained by the first and second maximum signal peak amplitude detector blocks 400A, 400B, respectively, and $\min_{t \in T}(V_{INP}(t))$ and $\min_{t \in T}(V_{INM}(t))$ are the negative peaks of the first and second input signals obtained by the first and second minimum signal peak amplitude detector blocks 500A, 500B, respectively.

Mathematically, the fourth to sixth error flags described above are given by $$\text{STATIC}P = \Theta(A_{MIN} - A_{INP}), \quad (20)$$

$$\text{STATIC}M = \Theta(A_{MIN} - A_{INM}), \quad (21)$$

$$\text{UNBAL} = \Theta(A_{INP} - M_F A_{INM}) \text{ OR } \Theta(A_{INM} - M_F A_{INP}), \quad (22)$$

where $A_{MIN}$ is the minimum allowed amplitude at the inputs and $M_F$ is the multiplication factor. For instance, $M_F$ may be chosen between 2 and 4, e.g. 3.

Figure 9:
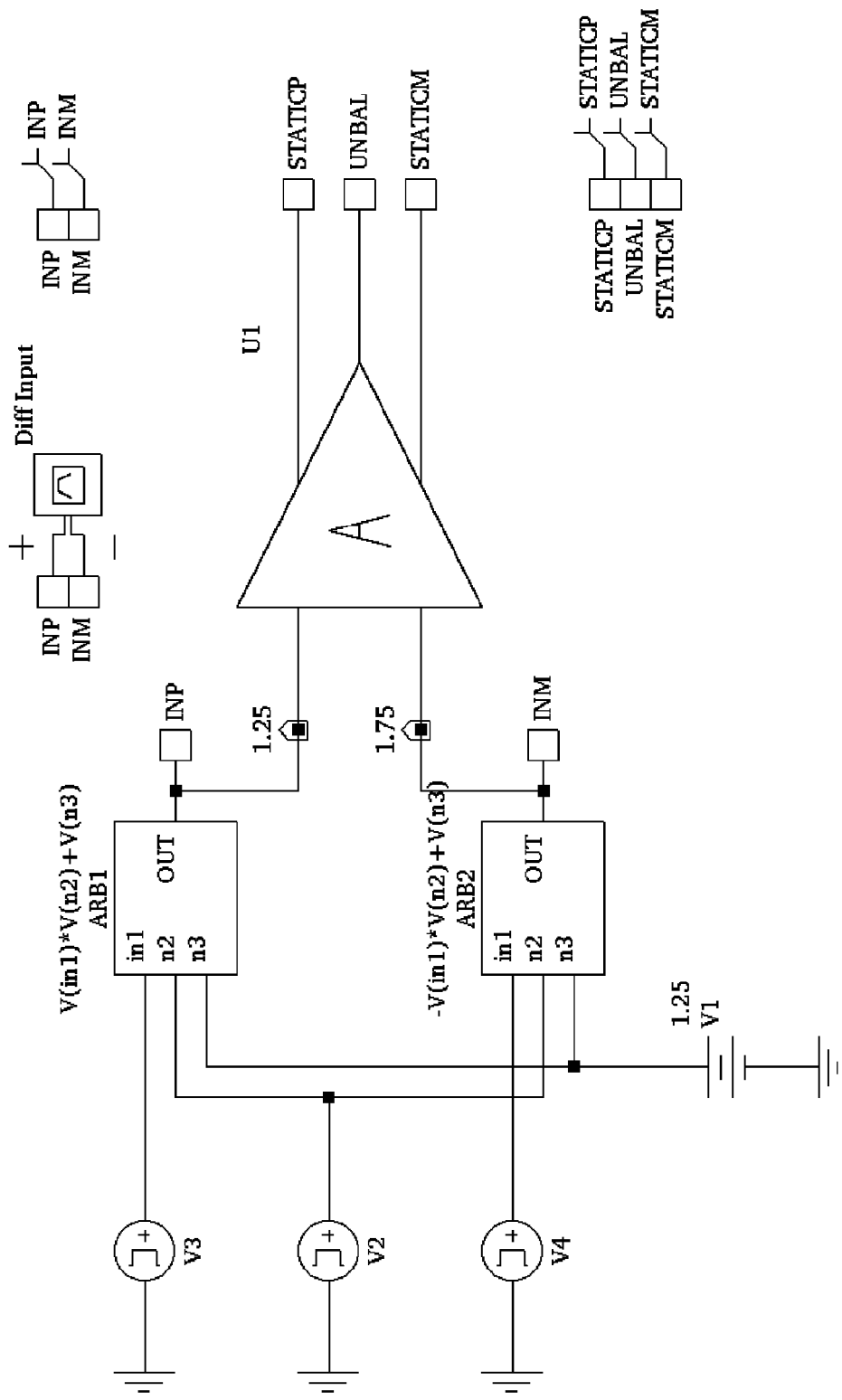
FIG. 9 schematically illustrates a test bench for testing the link failure detection block of FIG. 3.
Figure 13:
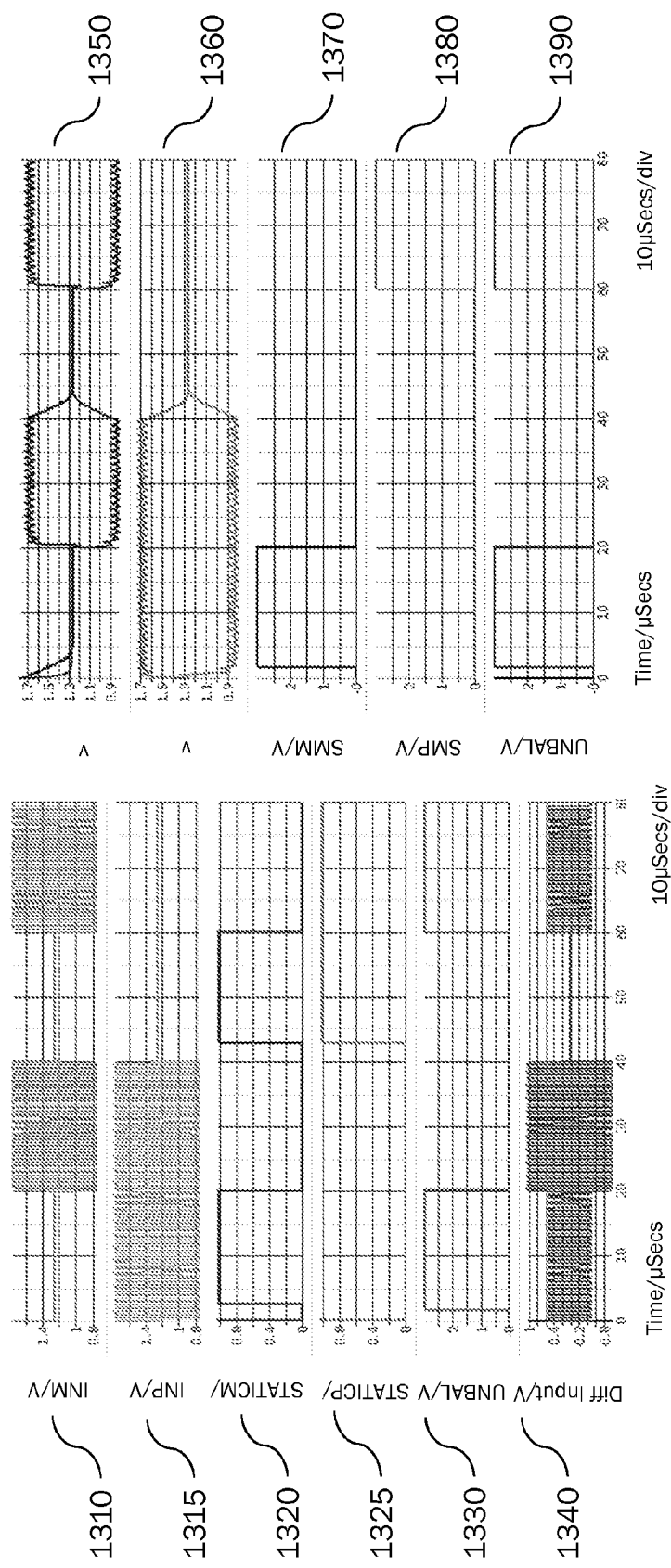
FIG. 13 shows a simulation result for the link failure detection block of FIG. 3.

Simulation results for the first link failure detection block 600 will now be described with reference to FIG. 9 and FIG. 13. FIG. 9 shows a test bench for testing the first link failure detection block 600, and respective simulation results are shown in FIG. 13. In FIG. 13, waveforms from the top of the test bench are shown in the left column (grids 1310, 1315, 1320, 1325, 1330, 1340) and waveforms from the fourth link failure detection block 300 are shown in the right column (grids 1350, 1360, 1370, 1380, 1390). The two grids 1350, 1360 on the top in the right column show the peak detector maximum and minimum levels for the negative input (INM_MAX and INM_MIN) and for the positive input (INP_MAX and INP_MIN). The test bench signals shown in the left column are: the input signals INM and INP, the differential input signal Diff Input and signal quality flags, STATICP 180 (high for low positive input signal amplitude), STATICM 182 (high for low negative input signal amplitude), and UNBAL 181 (i.e. UNBAL, high when either of the positive or the negative input signals is significantly larger than the other one, in other words, when the signal is unbalanced). As can be seen from the left column, the positive and negative input signals are changed independently of each other in the test bench. It should be noted that the input signal swing includes both the LVDS signal as well as the common-mode signal. The common-mode signal is stripped by the low-noise amplifier 130 in FIG. 1 and the differential signal amplitude is monitored after the low-noise amplifier 130.

With regard to single or double short circuits, it is expected that it will cause at least one of the inputs to have a low amplitude signal that will be flagged as an error condition. The same applies for single or double open fault conditions, provided that the noise pick-up or induced self-oscillations are less than the expected signal amplitude threshold that will trigger the flag.

As described above, the second link failure detection block 700 flags an error if an average amplitude over time is smaller than a given fraction of the maximum peak amplitude. While such a result (low $A_{strength}$ compared to $A_{diff}$) is typical for small capacitive loads attached to an open circuit terminal, large capacitive loads will result in a very small signal at the input terminal. The latter condition will be detected by the fourth link failure detection block 300, and a corresponding fourth or fifth error flag would be raised. Hence, single open circuits are detected by either one of the second failure detection block 700 and the fourth link failure detection block 300. For the double open failure, all noise picked-up that enters the LVDS receiver and that is smaller than the minimum amplitude threshold (e.g. 100 mV) is flagged as an erroneous signal by the fourth link failure detection block 300. Further, for the special case of a double open failure in which self-oscillation occurs, the asymmetry in the positive and negative signal swings would be detected by the fourth link failure detection block 300 and flagged as an error.

Link Quality Monitor

All error flags are collected at the link quality monitor 160, processed and forwarded to the communication link monitoring failure flag (FAIL). This signal can contain either the OR-ed output of all detector outputs (i.e. an OR of all applicable error flags), or a serial repetitive bit stream containing all the detector outputs. In the former case, the communication link monitoring failure flag is a global single static flag, while in the latter case it is a bit stream of coded information explaining multiple aspects of the quality of the input LVDS signal.

The link quality monitor 160 takes also into account the maximum frequency of the LVDS signal received, since high frequencies are indicative of self-oscillations and should be reported. The required connections for this functionality are not shown in FIG. 1.

Overview of Failure Conditions

The four basic failure modes have been listed in the Background section above. Now, a more detailed overview of the different failure modes and their characteristics is presented. The failure signatures differ depending on the LVDS hardware implementation in terms of attached line capacitance and the noise/interference picked-up in case of an open circuit condition. The different failure conditions can be categorized as follows:

Main failure conditions:
1) single short circuit failure: one input line is short circuited to a fixed voltage
2) double short circuit failure: both input lines are short circuited to respective fixed voltages 3) single open circuit failure: one input line is disconnected
4) double open circuit failure: both input lines are disconnected The main failure conditions 1) to 4) can be further specified by the below categories according to termination resistor configurations, line capacitive loads and noise/interference pick that depend on specific implementations of the LVDS receiver.

Remaining capacitive load attached to terminal after open circuit condition:
- k) small—(10 pF)—potential induced LVDS signal level larger than half the expected LVDS signal amplitude
- l) medium—(100 pF)—potential induced LVDS signal level smaller than half the expected LVDS signal amplitude, but larger than the minimum allowed LVDS signal.
- m) large—(1000 pF)—potential induced LVDS signal level smaller than half the expected LVDS signal amplitude and smaller than the minimum allowed LVDS signal.

Common-signal amplitude signal due to termination resistors at output of LVDS source:
- p) small common-mode signal—less than the minimum signal amplitude
- q) large common-mode signal—larger than the minimum LVDS signal amplitude Noise/interference pick-up amplitude:
- w) maximum noise level below the minimum single-ended amplitude level—150 mVp
- v) minimum noise/interference level below the minimum single-ended amplitude level—150 mVp
- x) minimum noise/interference level above the minimum single-ended amplitude level—150 mVp It is to be noted that combinations of the above failure conditions can be detected by the present invention in absence of large common-mode and noise/interference signals. Since the latter are not expected to be permanently present, the present invention is capable of detecting and flagging the most important LVDS link failure conditions.

While the combination of all four detectors (link failure detection blocks) described above in the LVDS receiver will enable the detection of, as a minimum, the failure modes listed above, the present invention is not limited to a combination of all four detectors, since also detection of subsets or single ones of these failure modes may be appropriate, given the circumstances of employment of the LVDS receiver. Thus, an apparatus according to the present invention may comprise any one, any two, any three or all four of the above detectors. It is further noted that an inventive apparatus comprising one or more of the detectors described above may be provided separately from the LVDS receiver, so that the inventive apparatus does not need to be capable of outputting the output signal (e.g. a single-ended signal) derived from the differential signal.

Further, as indicated earlier, it should be noted that instead of analog signal processing, analog-to-digital conversion and subsequent digital signal processing could as well be used to derive all the failure flags described above. It is to be noted that the present invention is to be understood to relate to both analog and digital signal processing.

While the present invention has been described mostly in terms of method steps performed by the respective first to fourth link failure detection blocks, the present disclosure is understood to likewise relate to respective apparatus features, and in particular to respective means for performing these method steps. While specific implementations by analog circuitry have been disclosed for these means, these means are not to be construed to be limited to said specific implementations.

Features, components, and specific details of the structures of the above-described embodiments may be exchanged and/or combined to form further embodiments optimized for the respective application. As far as those modifications are readily apparent for an expert skilled in the art, they shall be disclosed implicitly by the above description without specifying explicitly every possible combination, for the sake of conciseness of the present description.

The invention claimed is:

1. A method of determining link failure in a receiver for receiving a differential voltage signal via a first signal line and a second signal line, the method comprising:
   obtaining, using a link failure detector, a first quantity depending on the larger one of a maximum value over time of a voltage level that is attained in the first signal line and a maximum value over time of a voltage level that is attained in the second signal line;
   obtaining, using the link failure detector, a second quantity depending on a maximum value over time of an average of an instantaneous voltage level in the first signal line and an instantaneous voltage level in the second signal line;
   determining, using the link failure detector, that the link failure has occurred on the basis of the first quantity and the second quantity; and
   outputting an indication of the link failure.

2. The method according to claim 1, wherein determining that the link failure has occurred involves comparing the first quantity and the second quantity.

3. The method according to claim 1, further comprising:
   obtaining a third quantity depending on a time-integrated value of an absolute value of a difference between the instantaneous voltage level in the first signal line and the instantaneous voltage level in the second signal line; and
   determining that the link failure has occurred on the basis of the first quantity, the second quantity, and the third quantity.

4. The method according to claim 3, wherein determining that the link failure has occurred involves comparing the first quantity, the second quantity, and the third quantity.

5. The method according to claim 1, further comprising:
   applying a periodic current to the first signal line and the second signal line;
   obtaining a fourth quantity depending on an average value over time of an average of the instantaneous voltage level in the first signal line and the instantaneous voltage level in the second signal line;
   obtaining a fifth quantity depending on an average value over time of averages of the instantaneous voltage level in the first signal line and the instantaneous voltage level in the second signal line, said averages being sampled in accordance with the periodic current;
   determining that the link failure has occurred on the basis of the fourth quantity and the fifth quantity.

6. The method according to claim 5, wherein determining that the link failure has occurred involves comparing the fourth quantity and the fifth quantity.

7. The method according to claim 1, further comprising:
   obtaining a sixth quantity depending on a maximum value over time of a voltage level that is attained in one of the first signal line and the second signal line and a minimum value over time of the voltage level that is attained in the one of the first signal line and the second signal line; and determining that the link failure has occurred on the basis of the sixth quantity.

8. The method according to claim 7, wherein determining that the link failure has occurred involves comparing the sixth quantity to a predetermined threshold value.

9. The method according to claim 7, further comprising:
obtaining a seventh quantity depending on a maximum value over time over of a voltage level that is attained in the other one of the first signal line and the second signal line and a minimum value over time of the voltage level that is attained in the other one of the first signal line and the second signal line; and
determining that the link failure has occurred on the basis of the sixth quantity and the seventh quantity.

10. The method according to claim 9, wherein determining that the link failure has occurred involves comparing the sixth quantity and the seventh quantity.

11. The method according to claim 1, wherein the link failure detector determines whether the link failure has occurred by comparing the first quantity to the second quantity.

12. The method according to claim 1, wherein the link failure detector determines whether the link failure has occurred by determining a difference between the first quantity and the second quantity and determining if the difference is less than a predetermined threshold value.

13. An apparatus for determining link failure in a receiver for receiving a differential voltage signal via a first signal line and a second signal line, the apparatus comprising:
first determining means for obtaining a first quantity depending on the larger one of a maximum value over time of a voltage level that is attained in the first signal line and a maximum value over time of a voltage level that is attained in the second signal line;
second determining means for obtaining a second quantity depending on a maximum value over time of an average of an instantaneous voltage level in the first signal line and an instantaneous voltage level in the second signal line; and
link failure determining means for determining that the link failure has occurred and for outputting an indication of the link failure,
wherein the link failure determining means is configured to determine that the link failure has occurred on the basis of the first quantity and the second quantity.

14. The apparatus according to claim 13, further comprising:
third determining means for obtaining a third quantity depending on a time-integrated value of an absolute value of a difference between the instantaneous voltage level in the first signal line and the instantaneous voltage level in the second signal line,
wherein the link failure determining means is configured to determine that the link failure has occurred on the basis of the first quantity, the second quantity, and the third quantity.

15. The apparatus according to claim 13, further comprising:
current generation means for applying a periodic current to the first signal line and the second signal line;
fourth determining means for obtaining a fourth quantity depending on an average value over time of an average of the instantaneous voltage level in the first signal line and the instantaneous voltage level in the second signal line; and
fifth determining means for obtaining a fifth quantity depending on an average of the instantaneous voltage level in the first signal line and the instantaneous voltage level in the second signal line, said averages being sampled in accordance with the periodic current,
wherein the link failure determining means is configured to determine that the link failure has occurred on the basis of the fourth quantity and the fifth quantity.

16. The apparatus according to claim 13, further comprising: sixth determining means for obtaining a sixth quantity depending on a maximum value over time of a voltage level that is attained in one of the first signal line and the second signal line and a minimum value over time of a voltage level that is attained in the one of the first signal line and the second signal line,
wherein the link failure determining means is configured to determine that the link failure has occurred on the basis of the sixth quantity.

17. The apparatus according to claim 16, further comprising:
seventh determining means for obtaining a seventh quantity depending on a maximum value over time over of a voltage level that is attained in the other one of the first signal line and the second signal line and a minimum value over time of a voltage level that is attained in the other one of the first signal line and the second signal line,
wherein the link failure determining means is configured to determine that the link failure has occurred on the basis of the sixth quantity and the seventh quantity.

18. The apparatus according to claim 13, wherein the link failure determining means determines whether the link failure has occurred by comparing the first quantity to the second quantity.

19. The apparatus according to claim 13, wherein the link failure determining means determines whether the link failure has occurred by determining a difference between the first quantity and the second quantity and determining if the difference is less than a predetermined threshold value.

* * * * *